(12) United States Patent
Liu et al.

(10) Patent No.: US 11,842,665 B2
(45) Date of Patent: Dec. 12, 2023

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Cong Liu, Beijing (CN); Hongjun Zhou, Beijing (CN); Lili Du, Beijing (CN); Feng Wei, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 161 days.

(21) Appl. No.: 17/434,481

(22) PCT Filed: Nov. 25, 2020

(86) PCT No.: PCT/CN2020/131497
§ 371 (c)(1),
(2) Date: Aug. 27, 2021

(87) PCT Pub. No.: WO2022/109874
PCT Pub. Date: Jun. 2, 2022

(65) Prior Publication Data
US 2022/0180784 A1  Jun. 9, 2022

(51) Int. Cl.
*G09G 3/32* (2016.01)
*G09G 3/20* (2006.01)
(Continued)

(52) U.S. Cl.
CPC ............ *G09G 3/20* (2013.01); *H01L 27/0296* (2013.01); *H10K 50/844* (2023.02);
(Continued)

(58) Field of Classification Search
CPC ............ G09G 3/20; G09G 2310/0297; G09G 2310/08; G09G 2330/04; H01L 27/0296;
(Continued)

(56) References Cited

U.S. PATENT DOCUMENTS

| 7,999,357 B1 * | 8/2011 | Chan | H01L 27/0255 |
| | | | 257/653 |
| 10,170,534 B1 * | 1/2019 | Kim | H10K 59/1315 |

(Continued)

FOREIGN PATENT DOCUMENTS

| CN | 103268876 A | 8/2013 |
| CN | 106504696 A | 3/2017 |

(Continued)

*Primary Examiner* — Pegeman Karimi
(74) *Attorney, Agent, or Firm* — Westman, Champlin & Koehler, P.A.

(57) ABSTRACT

The present disclosure provides a display panel and a display device. The display panel includes: a base substrate including a display area and a peripheral area surrounding the display area; a plurality of sub-pixels; a plurality of data signal lines; a plurality of data wires located in the peripheral area and electrically connected to the plurality of data signal lines; an electrostatic discharge circuit located in the peripheral area on the base substrate, and electrically connected to the plurality of data wires; and an encapsulation layer located on a side of the plurality of sub-pixels and the electrostatic discharge circuit away from the base substrate, wherein an orthographic projection of the electrostatic discharge circuit on the base substrate is located within an orthographic projection of the encapsulation layer on the base substrate.

18 Claims, 17 Drawing Sheets

(51) Int. Cl.
*H01L 27/02* (2006.01)
*H10K 50/844* (2023.01)
*H10K 59/126* (2023.01)
*H10K 59/131* (2023.01)
*H10K 77/10* (2023.01)
*H10K 102/00* (2023.01)

(52) U.S. Cl.
CPC ......... *H10K 59/126* (2023.02); *H10K 59/131* (2023.02); *H10K 77/111* (2023.02); *G09G 2310/0297* (2013.01); *G09G 2310/08* (2013.01); *G09G 2330/04* (2013.01); *H10K 2102/311* (2023.02)

(58) Field of Classification Search
CPC .............. H01L 27/0266; H10K 50/844; H10K 59/126; H10K 59/131; H10K 77/111; H10K 2102/311; Y02E 10/549
See application file for complete search history.

(56) References Cited

U.S. PATENT DOCUMENTS

| | | | |
|---|---|---|---|
| 10,644,091 B2 | 5/2020 | Liu et al. | |
| 10,923,548 B2 | 2/2021 | Zhou et al. | |
| 2002/0027621 A1 | 3/2002 | Chae | |
| 2008/0094562 A1 | 4/2008 | Lee et al. | |
| 2009/0085843 A1 | 4/2009 | Hiromasu | |
| 2015/0294985 A1 | 10/2015 | Hekstra | |
| 2017/0179432 A1* | 6/2017 | Visweswaran | H10K 50/828 |
| 2018/0337226 A1 | 11/2018 | Liu et al. | |
| 2019/0067409 A1* | 2/2019 | Shin | H01L 27/0266 |
| 2019/0214451 A1 | 7/2019 | Kajiyama et al. | |
| 2020/0144247 A1 | 5/2020 | Long | |
| 2020/0273930 A1 | 8/2020 | Zhou et al. | |
| 2021/0191480 A1 | 6/2021 | Peng et al. | |
| 2022/0115280 A1* | 4/2022 | Du | G02F 1/133 |
| 2022/0310739 A1* | 9/2022 | Wei | H10K 50/846 |

FOREIGN PATENT DOCUMENTS

| | | |
|---|---|---|
| CN | 107393907 A | 11/2017 |
| CN | 108493226 A | 9/2018 |
| CN | 208336227 U | 1/2019 |
| CN | 109887969 A | 6/2019 |
| CN | 110391222 A | 10/2019 |
| CN | 111129094 A | 5/2020 |

* cited by examiner

DISPLAY PANEL AND DISPLAY DEVICE

CROSS REFERENCE TO RELATED APPLICATION(S)

This application is a Section 371 National Stage Application of International Application No. PCT/CN2020/131497, filed on Nov. 25, 2020, entitled "DISPLAY PANEL AND DISPLAY DEVICE", the contents of which are incorporated herein by reference in their entireties.

TECHNICAL FIELD

The present disclosure relates to a field of display technology, and in particular to a display panel and a display device.

BACKGROUND

For display products, static electricity generated during production and use can affect display quality and even damage the display products. For this reason, an electrostatic discharge (ESD) circuit is usually provided in a display panel to protect an internal circuit in the display panel. However, the electrostatic discharge circuit in convention technologies does not have a satisfactory discharge effect.

SUMMARY

The embodiments of the present disclosure provide a display panel, and the display panel includes: a base substrate including a display area and a peripheral area surrounding the display area; a plurality of sub-pixels located in the display area on the base substrate, wherein the plurality of sub-pixels are arranged in an array; a plurality of data signal lines located in the display area and electrically connected to the plurality of sub-pixels, wherein the plurality of data signal lines are configured to transmit data signals to the plurality of sub-pixels; a plurality of data wires located in the peripheral area and electrically connected to the plurality of data signal lines; an electrostatic discharge circuit located in the peripheral area on the base substrate, and electrically connected to the plurality of data wires; and an encapsulation layer located on a side of the plurality of sub-pixels and the electrostatic discharge circuit away from the base substrate, wherein an orthographic projection of the electrostatic discharge circuit on the base substrate is located within an orthographic projection of the encapsulation layer on the base substrate.

For example, an edge of the peripheral area includes a ring-shaped encapsulation area surrounding the display area, a ring-shaped dam is provided within the encapsulation area, and the electrostatic discharge circuit is located between the encapsulation area and the display area.

For example, the encapsulation layer includes a first inorganic material layer, a second inorganic material layer, and an organic material layer located between the first inorganic material layer and the second inorganic material layer, wherein the organic material layer is located in an area enclosed by the ring-shaped dam, and the first inorganic material layer and the second inorganic material layer are located on a side of the dam away from the base substrate.

For example, the encapsulation layer includes a cover plate; and an edge of the peripheral area includes a ring-shaped encapsulation area surrounding the display area, an adhesive layer is provided within the encapsulation area on a side of the cover plate facing the base substrate, and the electrostatic discharge circuit is located between the encapsulation area and the display area.

For example, the electrostatic discharge circuit includes a plurality of electrostatic discharge units electrically connected to the plurality of data wires respectively, wherein at least one or more of the plurality of electrostatic discharge units is arranged along an edge of the display area.

For example, an edge of the display area facing the electrostatic protection circuit has at least one arc-shaped part, and the at least one or more of the plurality of electrostatic discharge units is arranged along the at least one arc-shaped part.

For example, each of the at least one or more of the plurality of electrostatic discharge units has a first reference axis and a second reference axis perpendicular to the first reference axis, wherein the first reference axis is parallel to a normal direction of an arc-shaped part adjacent to the each of the at least one or more of the plurality of electrostatic discharge units, and the second reference axis is parallel to a tangential direction of the arc-shaped part adjacent to the each of the at least one or more of the plurality of electrostatic discharge units.

For example, each of the at least one or more of the plurality of electrostatic discharge units has a first reference axis and a second reference axis perpendicular to the first reference axis, the first reference axis is parallel to a first direction, and the second reference axis is parallel to a second direction, and wherein the first direction is a row direction of the array, and the second direction is a column direction of the array.

For example, the display area has a circular outline, and the plurality of electrostatic discharge units are arranged along an arc-shaped edge of the circular outline on a side of the circular outline facing the electrostatic discharge circuit.

For example, the display area has a rounded rectangular outline, and one or more of the plurality of electrostatic discharge units is arranged along a rounded arc-shaped edge of the rounded rectangular outline on a side of the rounded rectangular outline facing the one or more of the plurality of electrostatic discharge units, and another one or more of the plurality of electrostatic discharge units is arranged along a straight edge of the rounded rectangular outline on a side of the rounded rectangular outline facing the another one or more of the plurality of electrostatic discharge units.

For example, the display area has a rectangular outline, and the plurality of electrostatic discharge units are arranged along a straight edge of the rectangular outline on a side of the rectangular outline facing the plurality of electrostatic discharge units.

For example, the display panel further includes: a first power signal line located between the electrostatic discharge circuit and the display area, and electrically connected to the electrostatic discharge circuit; and a first reference signal line located between the electrostatic discharge circuit and the encapsulation area, and electrically connected to the electrostatic discharge circuit, wherein a voltage at the first power signal line is higher than a voltage at the first reference signal line.

For example, a power signal terminal of each of the plurality of electrostatic discharge units is electrically connected to the first power signal line, a reference signal terminal of each of the plurality of electrostatic discharge units is electrically connected to the first reference signal line, and an output terminal of each of the plurality of electrostatic discharge units is electrically connected to at least one of the plurality of data wires.

For example, the display panel further includes: a gate driving circuit located between the display area and the electrostatic discharge circuit; a plurality of gate signal lines located in the display area and electrically connected to the plurality of sub-pixels, wherein the gate driving circuit is electrically connected to the plurality of sub-pixels in the display area through the plurality of gate signal lines; a second power signal line located between the gate driving circuit and the first reference signal line, and is electrically connected to the gate driving circuit; and a second reference signal line located between the second power signal line and the gate driving circuit, and electrically connected to the gate driving circuit, wherein a voltage at the second power signal line is higher than a voltage at the second reference signal line.

For example, the display panel further includes: a gate driving circuit located between the display area and the encapsulation area, and is electrically connected to the plurality of sub-pixels in the display area through a plurality of gate signal lines, wherein the electrostatic discharge circuit is located on a side of the gate driving circuit facing the encapsulation area; a second power signal line located between the gate driving circuit and the electrostatic discharge circuit, and electrically connected to the gate driving circuit and the electrostatic discharge circuit; and a second reference signal line located between the second power signal line and the gate driving circuit, and electrically connected to the gate driving circuit and the electrostatic discharge circuit, wherein a power signal terminal of each electrostatic discharge unit is electrically connected to the second power signal line, a reference signal terminal of each electrostatic discharge unit is electrically connected to the second reference signal line, and an output terminal of each electrostatic discharge unit is electrically connected to at least one of the plurality of data wires.

For example, the display panel further includes: a multiplexing circuit located between the display area and the encapsulation area, wherein the plurality of data wires are electrically connected to the plurality of data signal lines through the multiplexing circuit; and K selection signal lines located between the multiplexing circuit and the electrostatic discharge circuit, and electrically connected to the multiplexing circuit, wherein K is an integer greater than 1, wherein the multiplexing circuit comprises a plurality of multiplexing units, an input terminal of an $i^{th}$ multiplexing unit and an output terminal of an $i^{th}$ electrostatic discharge unit are connected to an $i^{th}$ data wire in the plurality of data wires, K output terminals of the $i^{th}$ multiplexing unit are connected to K data signal lines of the plurality of data signal lines respectively, and K control signal terminals of the $i^{th}$ multiplexing unit are connected to the K selection signal lines respectively, wherein i is an integer greater than or equal to 1.

For example, each electrostatic discharge unit includes a first electrostatic discharge sub-unit and a second electrostatic discharge sub-unit, each multiplexing unit includes a first multiplexing sub-unit and a second multiplexing sub-unit, and each data wire includes a first sub-wire, a second sub-wire, and a third sub-wire, wherein the first sub-wire of the $i^{th}$ data wire is connected to an input terminal of the first electrostatic discharge sub-unit of the $i^{th}$ electrostatic discharge unit and an input terminal of the second electrostatic discharge sub-unit of the $i^{th}$ electrostatic discharge unit; the second sub-wire of the $i^{th}$ data wire is connected between the input terminal of the first electrostatic discharge sub-unit of the $i^{th}$ electrostatic discharge unit and an input terminal of the first multiplexing sub-unit of the $i^{th}$ multiplexing unit; and the third sub-wire of the $i^{th}$ data wire is connected between the input terminal of the second electrostatic discharge sub-unit of the $i^{th}$ electrostatic discharge unit and an input terminal of the second multiplexing sub-unit of the $i^{th}$ multiplexing unit.

For example, the first electrostatic discharge sub-unit includes a first transistor, a second transistor, a third transistor, and a fourth transistor, a gate of the first transistor and a first electrode of the first transistor are electrically connected as a power signal terminal of the first electrostatic discharge sub-unit, a second electrode of the first transistor is electrically connected to a gate of the second transistor and a first electrode of the second transistor, and a second electrode of the second transistor, a gate of the third transistor, and a first electrode of the third transistor are electrically connected as an output terminal of the first electrostatic discharge sub-unit, and a second electrode of the third transistor is electrically connected to a gate of the fourth transistor and a first electrode of the fourth transistor, and a second electrode of the fourth transistor is used as a reference signal terminal of the first electrostatic discharge sub-unit; and the second electrostatic discharge sub-unit includes a fifth transistor, a sixth transistor, a seventh transistor, and an eighth transistor, a gate of the fifth transistor and a first electrode of the fifth transistor are electrically connected as a power signal terminal of the second electrostatic discharge sub-unit, a second electrode of the fifth transistor is electrically connected to a gate of the sixth transistor and a first electrode of the sixth transistor, and a second electrode of the sixth transistor, a gate of the seventh transistor, and a first electrode of the seventh transistor are electrically connected as an output terminal of the second electrostatic discharge sub-unit, and a second electrode of the seventh transistor is electrically connected to a gate of the eighth transistor and a first electrode of the eighth transistor, and a second electrode of the eighth transistor is used as a reference signal terminal of the second electrostatic discharge sub-unit.

For example, each electrostatic discharge unit includes a ninth transistor, a tenth transistor, an eleventh transistor, and a twelfth transistor, wherein a gate of the ninth transistor and a first electrode of the ninth transistor are electrically connected as a power signal terminal of the electrostatic discharge unit, and a second electrode of the ninth transistor is electrically connected to a gate of the tenth transistor and a first electrode of the tenth transistor, and a second electrode of the tenth transistor, a gate of the eleventh transistor and a first electrode of the eleventh transistor are electrically connected as an output terminal of the electrostatic discharge unit, a second electrode of the eleventh transistor is electrically connected to a gate of the twelfth transistor and a first electrode of the twelfth transistor, and a second electrode of the twelfth transistor is used as a reference signal terminal of the electrostatic discharge unit.

For example, the display panel further includes: a first clock signal line located between the second power signal line and the second reference signal line, and electrically connected to the gate driving circuit; and a second clock signal line located between the first clock signal line and the second power signal line, and electrically connected to the gate driving circuit.

For example, at least one sub-pixel of the plurality of sub-pixels includes a driving transistor, and the driving transistor having a gate, a source, and a drain, and wherein each electrostatic discharge unit includes a plurality of transistors each having a gate arranged in a same layer as the gate of the driving transistor, and a first electrode and a second electrode arranged in a same layer as the source of the driving transistor and the drain of the driving transistor.

The embodiments of the present disclosure further provide a display device including the display panel described above.

DETAILED DESCRIPTION OF EMBODIMENTS

Although the present disclosure will be fully described with reference to the accompanying drawings containing preferred embodiments of the present disclosure, it should be understood that those ordinary skilled in the art can modify the disclosure described herein while obtaining the technical effects of the present disclosure. Therefore, it should be understood that the above description is a broad disclosure for those ordinary skilled in the art, and its content is not intended to limit the exemplary embodiments described in the present disclosure.

In addition, in the following detailed description, for the convenience of explanation, many specific details are set forth to provide a comprehensive understanding of the embodiments of the present disclosure. However, obviously, one or more embodiments can also be implemented without these specific details. In other cases, well-known structures and devices are embodied in an illustrative manner to simplify the accompanying drawings.

Figure 1A:
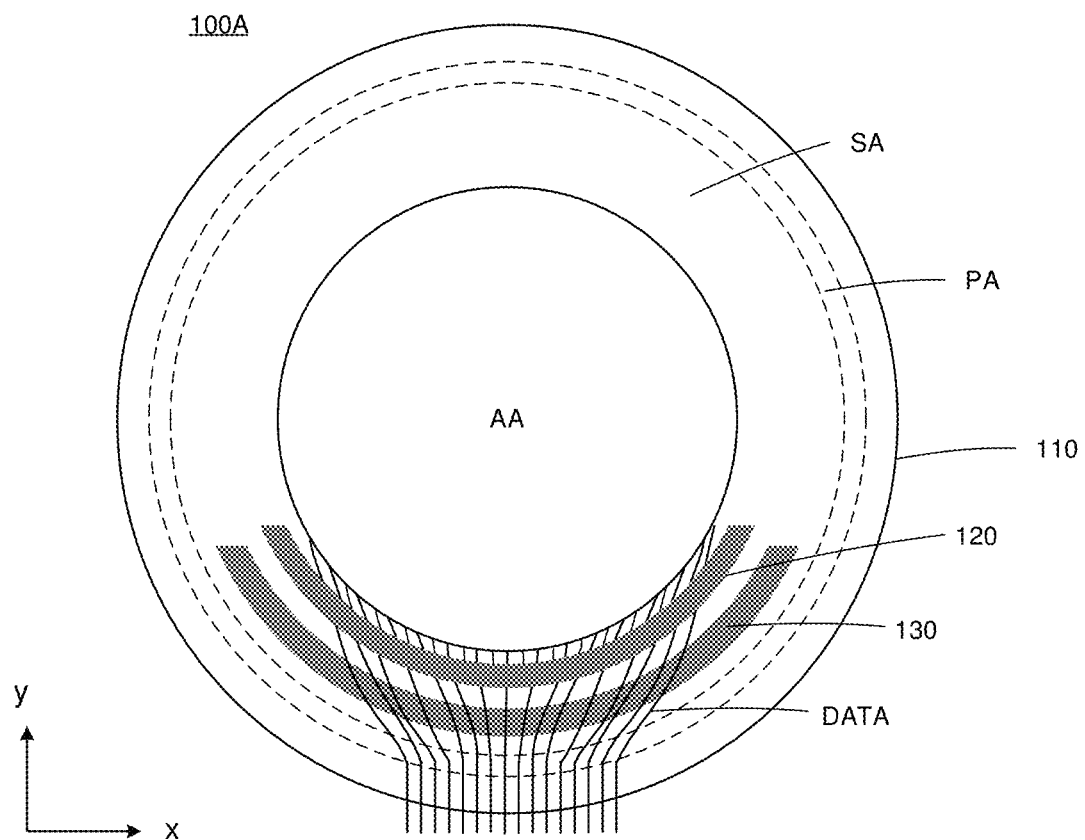
FIG. 1A shows a schematic diagram of a display panel according to the embodiments of the present disclosure.

FIG. 1A shows a schematic diagram of a display panel according to the embodiments of the present disclosure.

As shown in FIG. 1A, the display panel 100A includes a base substrate 110 and an electrostatic discharge circuit 130. The base substrate 110 is provided with a display area AA and a peripheral area SA surrounding the display area. An edge of the peripheral area SA includes a ring-shaped encapsulation area PA surrounding the display area AA. A plurality of sub-pixels are provided in the display area AA, and the electrostatic discharge circuit 130 is located between the display area AA and the encapsulation area PA. In FIG. 1A, a projection of the display area AA on the base substrate 110 has a circular outline, and the electrostatic discharge circuit 130 is located on a side of the display area AA along a y direction, and surrounds a part of an arc-shaped edge of the display area AA. However, the embodiments of the present disclosure are not limited to this, and the display area AA may be designed to have outlines of other shapes as desired, such as an ellipse, a rectangle, a rounded rectangle, or even an irregular shape. In FIG. 1A, an outline shape of the base substrate 110 is the same as an outline shape of the display area AA, and each of the base substrate 110 and the display area AA has a circular outline. However, the embodiments of the present disclosure are not limited to this, and the outline shape of the base substrate 110 may be different from the outline shape of the display area AA. For example, in addition to a circular part as shown in FIG. 1A, the base substrate 110 may also include two rectangular parts located on both sides of the circular portion, for example, for a special-shaped display device such as a watch.

The display panel 100A further includes a plurality of data wires DATA located in the peripheral area SA. The plurality of data wires DATA are located on a side of the display area AA, and may be electrically connected to the plurality of sub-pixels in the display area AA through data signal lines in the display area AA. The electrostatic discharge circuit 130 is electrically connected to the plurality of data wires DATA for discharging static electricity on the plurality of data wires DATA. The plurality of data wires DATA may be led out from the display panel 110 to be electrically connected to a driver IC. In some embodiments, the display panel 100A may further include a multiplexing circuit 120. The multiplexing circuit 120 is electrically connected to the plurality of data wires DATA, and the multiplexing circuit 120 may multiplex m input data signals at the plurality of data wires DATA into M output data signals, and provide the M output data signals to the plurality of sub-pixels in the display area AA through the data signal lines in the display area AA, wherein m and M are both integers greater than 1, and M is an integer multiple of m.

In a conventional technology, the electrostatic discharge circuit is usually located in a peripheral area of the encapsulation area, such as on a flexible circuit board located at a periphery of the encapsulation area. On the one hand, the data wire between the electrostatic discharge circuit and the display area has excess length, such that the electrostatic discharge effect is not satisfactory. On the other hand, the electrostatic discharge circuit is easily damaged. In the embodiments of the present disclosure, the electrostatic discharge circuit is located in an area between the encapsulation area PA and the display area AA. On the one hand, a length of the data wire between the electrostatic discharge circuit and pixels in the display area AA is shortened, such that the quality of electrostatic discharge is improved. On the other hand, the electrostatic discharge circuit may be protected by the encapsulation within the encapsulation area, thereby reducing a risk of damaging the electrostatic discharge circuit.

Figure 1B:
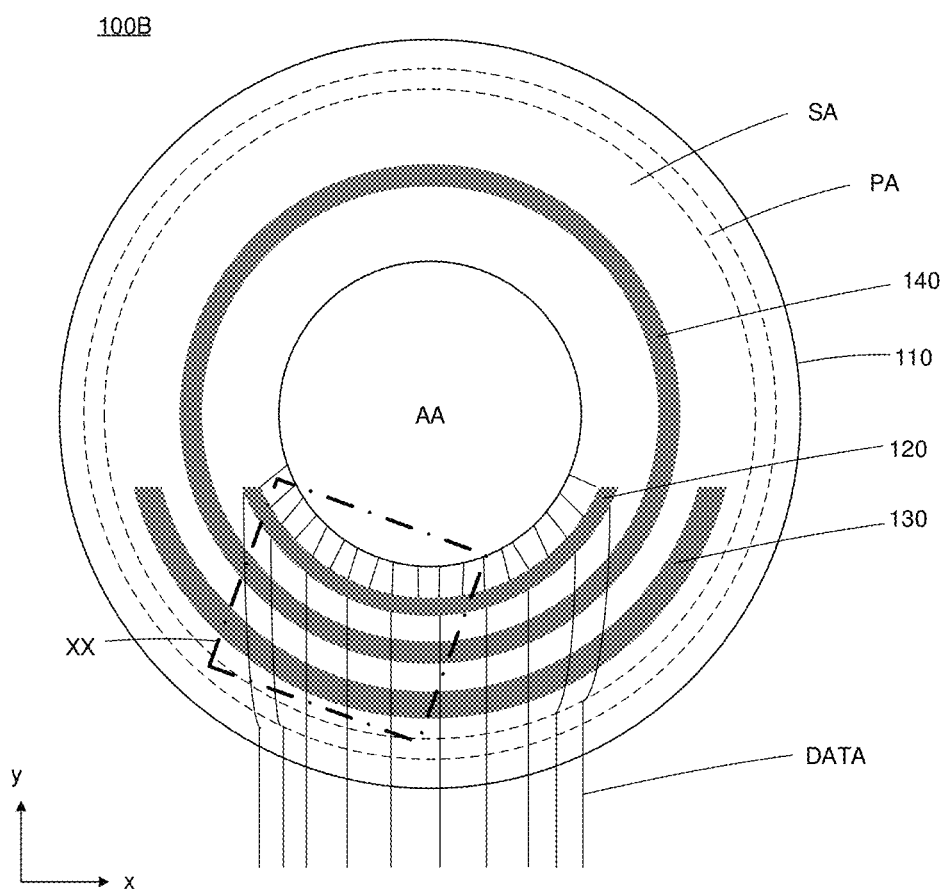
FIG. 1B shows a schematic diagram of a display panel according to the embodiments of the present disclosure.

FIG. 1B shows a schematic diagram of a display panel according to the embodiments of the present disclosure. The display panel 100B of FIG. 1B is similar to the display panel 100A described above, and differs from the display panel 100A at least in that the display panel 100B further includes a gate driving circuit 140. The above description of the display panel 100A is also applicable to the display panel 100B. For the sake of brevity, the following mainly describes the different parts in detail. As shown in FIG. 1B, the gate driving circuit 140 is located between the display area AA and the encapsulation area PA, and the electrostatic discharge circuit 130 is located on a side of the gate driving circuit 140 away from the display area AA. The gate driving circuit 140 may be electrically connected to the plurality of sub-pixels in the display area AA through a plurality of gate signal lines, which will be described in further detail below. In FIG. 1B, the gate driving circuit 140 is arranged around an entire edge of the display area AA, and the multiplexing circuit 120 is located in an area between the gate driving circuit 140 and the display area AA. However, the embodiments of the present disclosure are not limited to this, and the gate driving circuit 140 and the multiplexing circuit 120 may be laid out in other ways as desired.

Figure 2:
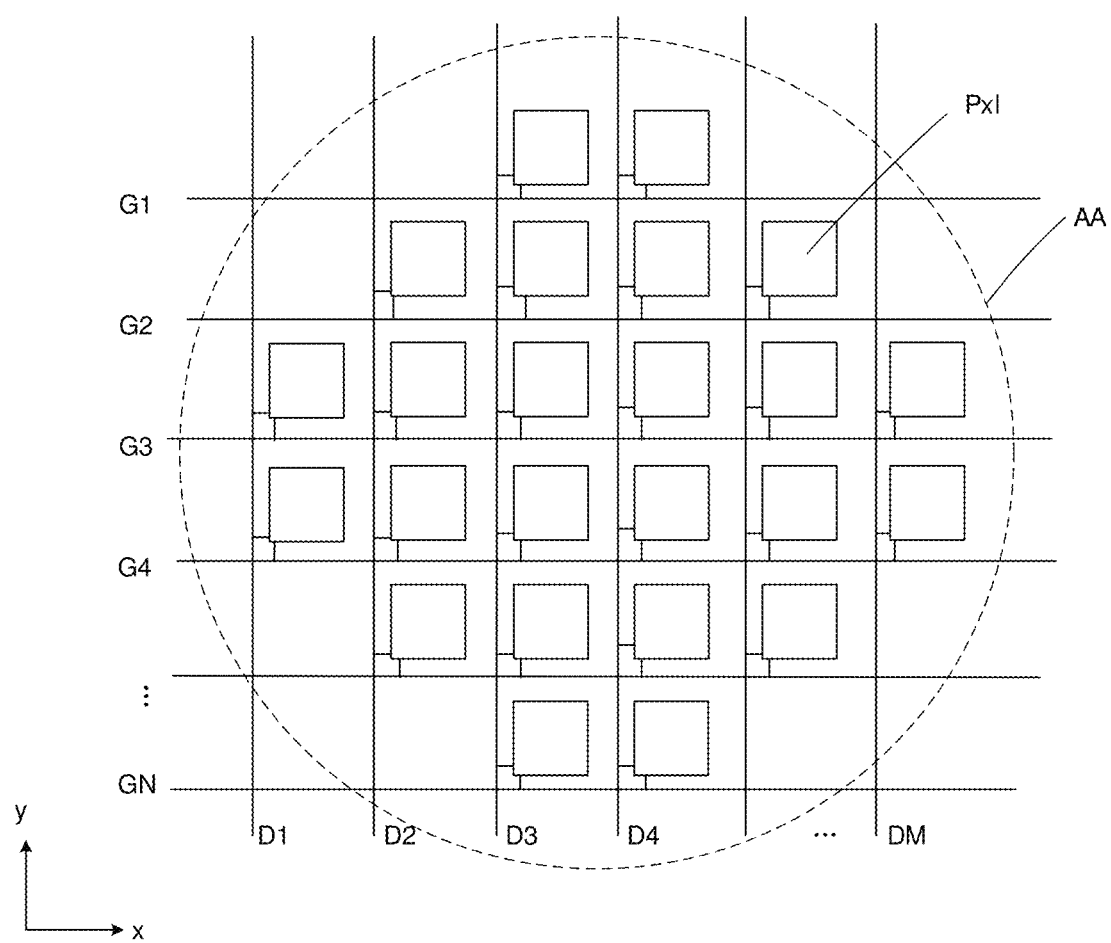
FIG. 2 shows a schematic diagram of a display area of a display panel according to the embodiments of the present disclosure.

FIG. 2 shows a schematic diagram of a display area in a display panel according to the embodiments of the present disclosure.

As shown in FIG. 2, a plurality of sub-pixels Px1 are located in the display area AA, and the plurality of sub-pixels Px1 are arranged in a form of an array. In FIG. 2, the plurality of sub-pixels Px1 are arranged in N rows and M columns, with a row direction being an x direction (a second direction), and a column direction being a y direction (a first direction). As shown in FIG. 2, the number of sub-pixels of one row is different from the number of sub-pixels of another row, and the number of sub-pixels of one column is different from the number of sub-pixels of another column, so that the array is circular as a whole, and thus a projection of the display area AA on the base substrate 110 has a circular outline. However, the embodiments of the present disclosure are not limited to this, and the plurality of sub-pixels Px1 may be arranged in arrays of other shapes as desired, such as a rectangle, a rounded rectangle, and so on.

A plurality of gate signal lines G1, G2, . . . GN electrically connected to the plurality of sub-pixels Px1 are also located in the display area AA. A plurality of data signal lines D1, D2, . . . DM electrically connected to the plurality of sub-pixels Px1 are also located in the display area AA. In FIG. 2, N rows of sub-pixels Px1 are connected to N gate signal lines G1, G2, . . . GN in one-to-one correspondence, and M columns of sub-pixels Px1 are connected to M data signal lines D1, D2, . . . DM in one-to-one correspondence. That is to say, each row of sub-pixels is connected to one gate signal line, and each column of sub-pixels is connected to one data signal line. However, the embodiments of the present disclosure are not limited to this. The number and connection mode of the gate signal lines and the data signal lines may be selected as desired. For example, each row of sub-pixels may be connected to two gate signal lines, and the number of gate signal lines is twice the number of rows of sub-pixels. Alternatively every two columns of sub-pixels are connected to one data signal line, and the number of data signal lines is one-half of the number of columns of sub-pixels, and so on.

Figure 3:
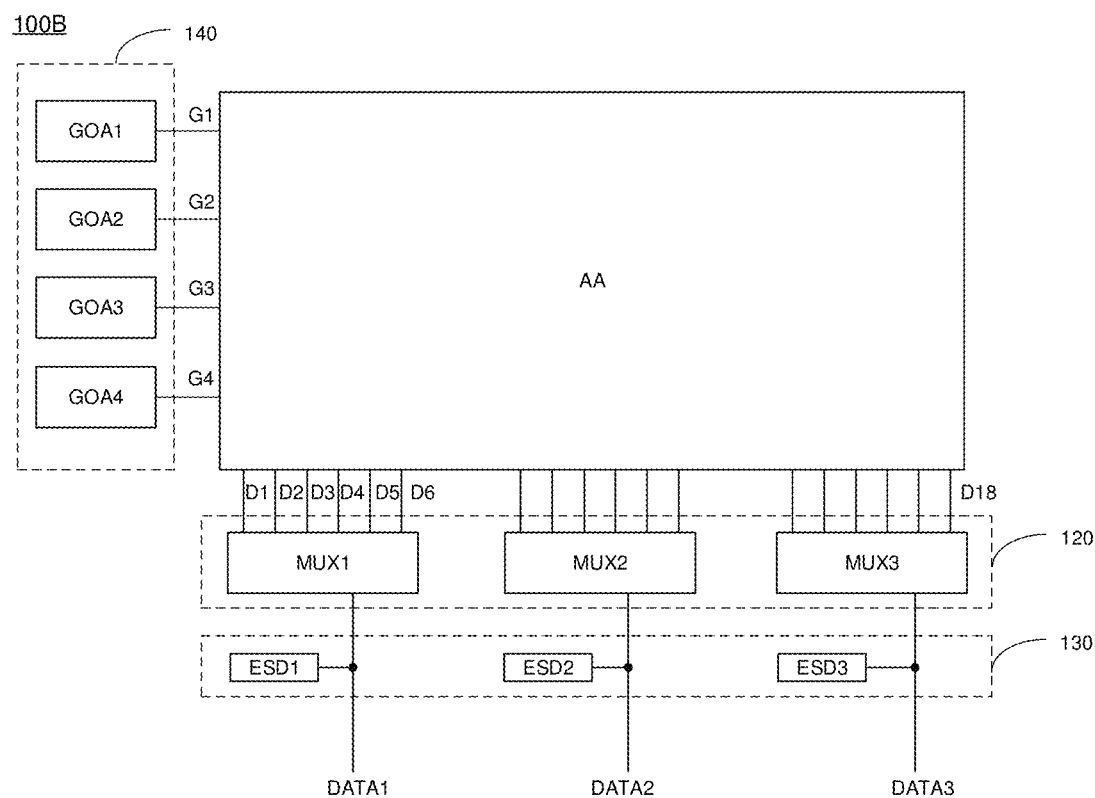
FIG. 3 shows a schematic circuit diagram of a display panel according to the embodiments of the present disclosure.

FIG. 3 shows a schematic circuit diagram of a display panel according to the embodiments of the present disclosure.

As shown in FIG. 3, the multiplexing circuit 120 includes a plurality of multiplexing units MUX1, MUX2, . . . MUXm, and m=3 in FIG. 3. The multiplexing units MUX1, MUX2, . . . MUXm are electrically connected to data wires DATA1, DATA2, . . . DATAm, respectively. In FIG. 3, each of the plurality of multiplexing units MUX1, MUX2, . . . MUXm may be a one-to-six multiplexing unit, that is, each multiplexing unit may multiplex one input data signal into six output data signals, and the six output data signals are provided to six data signal lines, respectively. For example, an input terminal of the multiplexing circuit MUX1 is connected to the data wire DATA1, and output terminals of the multiplexing circuit MUX1 are connected to data signal lines D1 to D6. The multiplexing circuit MUX1 may multiplex an input data signal at the data wire DATA1 into six output data signals, and provide the six output data signals to the data signal lines D1 to D6. In a similar manner, the multiplexing circuit MUX2 may multiplex an input data signal at the data wire DATA2 into six output data signals, and provide the six output data signals to data signal lines D7 to D12 respectively, and so on. In this way, the multiplexing circuit 120 may multiplex m input data signals at m data wires DATA into M output data signals and provide the M output data signals to M data signal lines D1 to DM respectively, such that the M output data signals are provided to M columns of sub-pixels in the display area AA, where M=6 m. In FIG. 3, m=3, M=18.

The electrostatic discharge circuit 130 may include a plurality of electrostatic discharge units ESD1, ESD2, . . . ESDm, and m=3 in FIG. 3. The electrostatic discharge units ESD1, ESD2, . . . ESDm are electrically connected to the data wires DATA1, DATA2, . . . DATAm, respectively. For example, the electrostatic discharge unit ESD1 is electrically connected to the data wire DATA1 to discharge static electricity on the data wire DATA1; and the electrostatic discharge unit ESD2 is electrically connected to the data wire DATA2 to discharge static electricity on the data wire DATA2, and so on.

The gate driving circuit 140 includes a plurality of shift register units GOA1, GOA2, . . . GOAN. The shift register units GOA1, GOA2, . . . GOAN are electrically connected to the gate signal lines G1, G2, . . . GN, respectively. For example, the shift register unit GOA1 is electrically connected to the gate signal line G1, the shift register unit GOA2 is electrically connected to the gate signal line G2, and so on. In this way, the gate driving circuit 140 is electrically connected to the plurality of rows of sub-pixels Px1 in the display area AA.

Although N=4, m=3, and M=12 is taken as an example in FIG. 3 for the convenience of description, the embodiments of the present disclosure are not limited to this. Values of m, M, and N may be set as desired.

Although a multiplexing circuit in the form of one-to-six is taken as an example in the above-mentioned embodiments, the embodiments of the present disclosure are not limited to this. The type of multiplexing circuit may be selected as desired, for example, a one-to-two multiplexing circuit, one-to-four multiplexing circuit, etc. may be used.

Although three data wires are taken as an example for description in the above-mentioned embodiments, the embodiments of the present disclosure are not limited to this. The number of data wires may be selected as desired. Each of the number of electrostatic discharge units and the number of multiplexing units may be equal to or different from the number of data wires.

Figure 4:
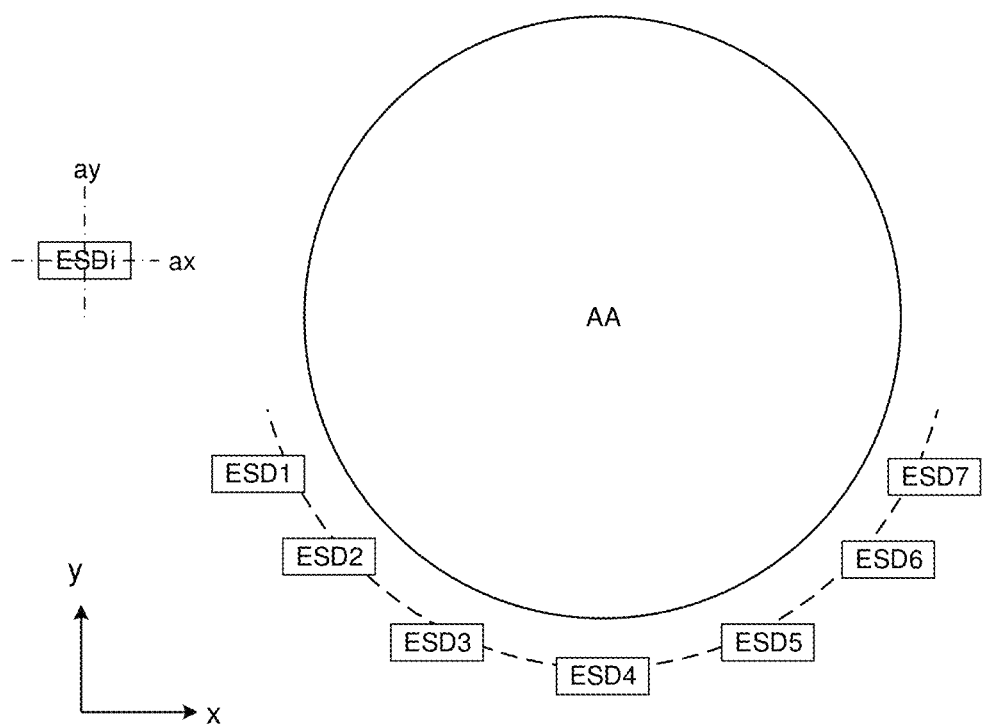
FIG. 4 shows a schematic layout diagram of electrostatic discharge circuits in a display panel according to the embodiments of the present disclosure.

FIG. 4 shows a schematic layout diagram of electrostatic discharge circuits in a display panel according to the embodiments of the present disclosure. A layout of the electrostatic discharge circuits in FIG. 4 is applicable to the display panel of any of the above-mentioned embodiments.

As shown in FIG. 4, a projection of the display area AA on the base substrate 110 has a circular outline, and a plurality of electrostatic discharge units ESD1, ESD2, ESDm are arranged along an arc-shaped edge of the circular outline of the display area AA, thereby surrounding a part of the display area AA. FIG. 4 shows seven electrostatic discharge units for ease of description, but those skilled in the art should understand that the embodiments of the present disclosure are not limited to this. Each electrostatic discharge unit ESDi may have a first reference axis ay and a second reference axis ax perpendicular to the first reference axis ay, where i is an integer and $1 \leq i \leq m$. In FIG. 4, a projection of each electrostatic discharge unit ESDi on the base substrate 110 may have a substantially rectangular outline, a symmetry axis of the rectangular outline parallel to its short side may be used as the first reference axis ay, and a symmetry axis of the rectangular outline parallel to its long side may be used as the second reference axis ax. As shown in FIG. 4, the first reference axis ay of each electrostatic discharge unit is parallel to the y direction, and the second reference axis ax of each electrostatic discharge unit is parallel to the x direction, so that the electrostatic discharge units ESD1, ESD2, . . . ESDm are arranged in a stepped manner along a track (shown by a dashed line in FIG. 4) that is substantially conformal to the outline of the display area AA.

Figure 5:
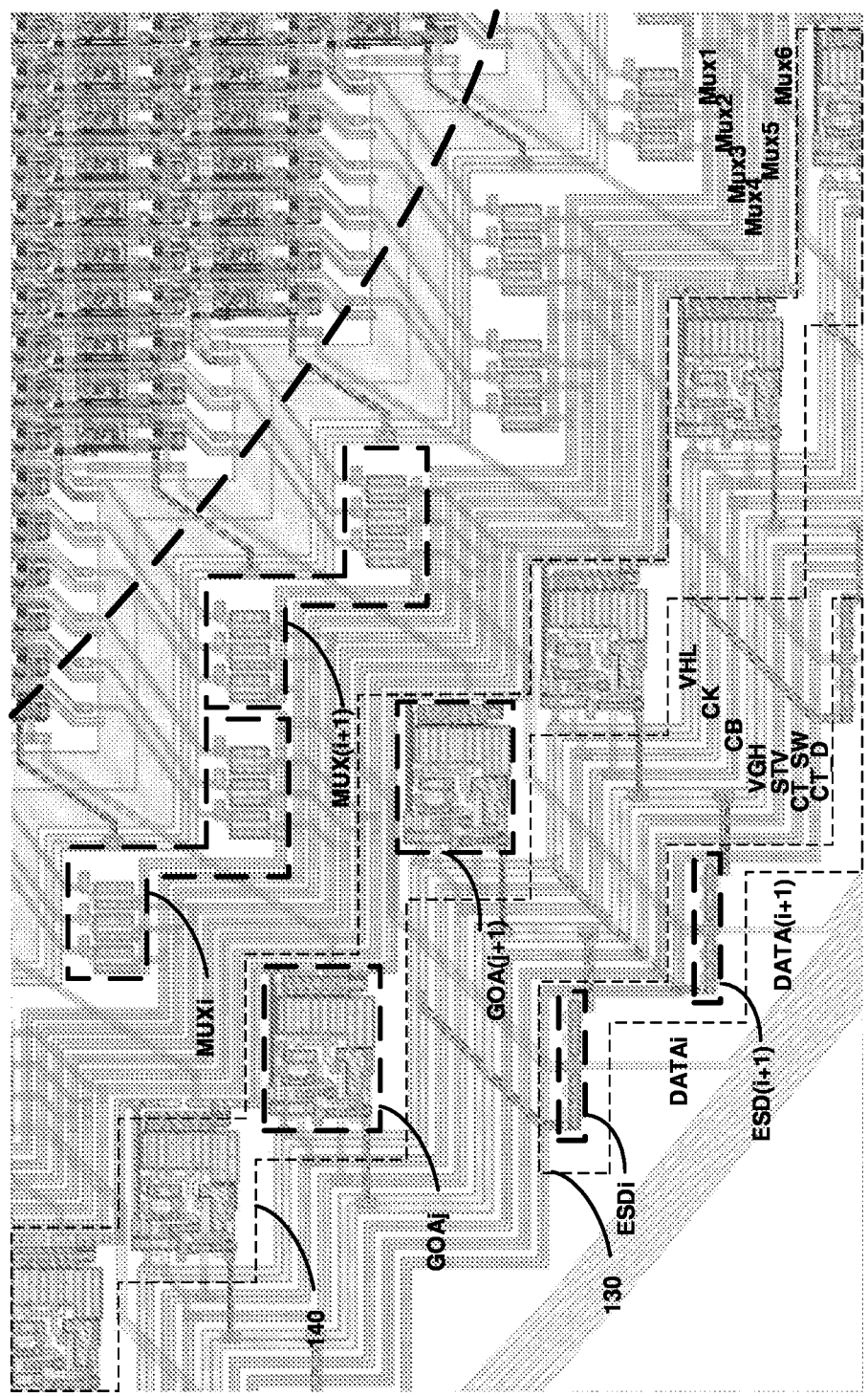
FIG. 5 shows a layout diagram of an example of an area XX of the display panel of FIG. 1B.
Figure 6:
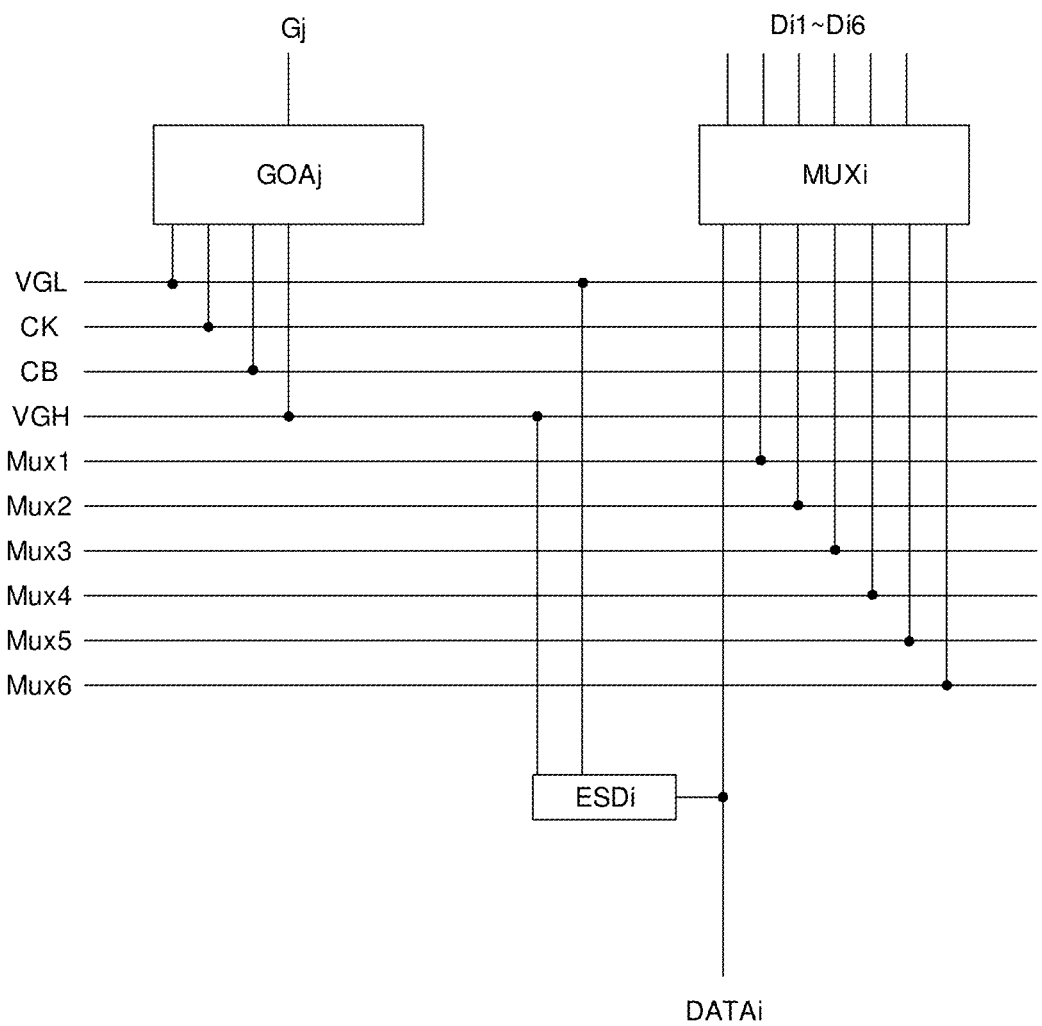
FIG. 6 shows a schematic circuit diagram of an area shown in FIG. 5.

FIG. 5 shows a layout diagram of an example of an area XX of the display panel of FIG. 1B. FIG. 6 shows a schematic circuit diagram of the area shown in FIG. 5.

As shown in FIG. 5, the display panel includes electrostatic discharge units ESD1, ESD2, . . . ESDm, multiplexing units MUX1, MUX2, . . . MUXm, and shift register units GOA1, GOA2, . . . GOAN. For ease of description, in FIG. 5, two electrostatic discharge units ESDi, ESD(i+1), two multiplexing units MUXi, MUX(i+1), and two shift register units GOAj, GOA(j+1) are denoted with dashed boxes.

In FIG. 5, the electrostatic discharge units ESD1, ESD2, . . . ESDm are arranged in a stepped manner as shown in FIG. 4 along a first track that is substantially conformal to the arc-shaped edge of the display area AA (shown by a dashed-dotted line in FIG. 5). The multiplexing units MUX1, MUX2, . . . MUXm are arranged in a stepped manner along a second track that is substantially conformal to the edge of the display area AA, which is similar to the electrostatic discharge units ESD1, ESD2, . . . ESDm. The shift register units GOA1, GOA2, . . . GOAN are arranged in a stepped manner along a third track that is substantially conformal to the edge of the display area AA, which is similar to the electrostatic discharge units ESD1, ESD2, . . . ESDm. In FIG. 5, the first track, the second track, and the third track are three tracks extending in parallel, the second track is located between the display area AA and the first track, and the third track is located between the second track and the first track.

As shown in FIGS. 5 and 6, the base substrate 110 is further provided with a second power signal line VGH and a second reference signal line VGL. The second power signal line VGH is located between the gate driving circuit 140 (including shift register units GOA1, GOA2, . . . GOAN) and the electrostatic discharge circuit 130 (including electrostatic discharge units ESD1, ESD2, . . . ESDm), and the second reference signal line VGL is located between the second power signal line VGH and the gate driving circuit 140. For the sake of brevity, in FIG. 6, a single shift register unit GOAj, a single multiplexing unit MUXi and a single electrostatic discharge unit ESDi are taken as an example for schematic illustration. The gate driving circuit 140 and the electrostatic discharge circuit 130 share the second power signal line VGH and the second reference signal line VGL. As shown in FIGS. 5 and 6, a power signal terminal of each of the shift register units GOA1, GOA2, . . . GOAN is electrically connected to the second power signal line VGH, and a reference signal terminal of each of the shift register units GOA1, GOA2, . . . GOAN is electrically connected to the second reference signal line VGL; a power signal terminal of each of the electrostatic discharge units ESD1, ESD2, . . . ESDm is electrically connected to the second power signal line VGH, and a reference signal terminal of each of the electrostatic discharge units ESD1, ESD2, . . . ESDm is electrically connected to the second reference signal line VGL.

As shown in FIGS. 5 and 6, the base substrate 110 is further provided with a first clock signal line CK and a second clock signal line CB thereon. The first clock signal line CK is located between the second power signal line VGH and the second reference signal line VGL, and the second clock signal line CB is located between the first clock signal line CK and the second power signal line VGH. Each of the shift register units GOA1, GOA2, . . . GOAN in the gate driving circuit 140 is electrically connected to the first clock signal line CK and the second clock signal line CB. For example, in FIG. 5, a first clock signal terminal of the shift register unit GOAj is electrically connected to the first clock signal line CK, and a second clock signal terminal of the shift register unit GOAj is electrically connected to the second clock signal line CB; a first clock signal terminal of the shift register unit GOA(j+1) is electrically connected to a second clock signal line CB, a second clock signal terminal of the shift register unit GOA(j+1) is electrically connected to the first clock signal line CK, and so on. Each shift register unit (for example, GOAj) provides a gate driving signal to a connected gate signal line (for example, Gj) based on a clock signal at the connected first clock signal line CK and a clock signal at the second clock signal line CB.

As shown in FIGS. 5 and 6, the base substrate 110 is further provided with K selection signal lines Mux1 to MuxK thereon, where K=6 in FIG. 5 and FIG. 6. The selection signal lines Mux1 to Mux6 are located between the multiplexing circuit 120 (including multiplexing units MUX1, MUX2, . . . MUXm) and the electrostatic discharge circuit 130 (including electrostatic discharge units ESD1, ESD2, . . . ESDm). In FIG. 5, the selection signal lines Mux1 to Mux6 are located between the multiplexing units MUX1, MUX2, . . . MUXm of the multiplexing circuit 120 and the shift register units GOA1, GOA2, . . . GOAN of the gate driving circuit 140. The selection signal lines Mux1 to Mux6 are electrically connected to the multiplexing circuit 120. As shown in FIGS. 5 and 6, six control signal terminals of the $i^{th}$ multiplexing unit MUXi are connected to the six selection signal lines Mux1 to Mux6, respectively, and an input terminal of the $i^{th}$ multiplexing unit MUXi is connected to the $i^{th}$ data wire DATAi, six output terminals of the $i^{th}$ multiplexing unit are connected to six data signal lines Di1 to Di6, respectively (for example, in a case of i=1, Di1 to Di6 are respectively D1 to D6, and in a case of i=2, Di1 to Di6 are respectively D6 to D12, and so on), where i is an integer greater than or equal to 1. An output terminal of the $i^{th}$ electrostatic discharge unit ESDi is also connected to the $i^{th}$ data wire DATAi.

In FIGS. 5 and 6, the second power signal line VGH, the second reference signal line VGL, the first clock signal line CK, the second clock signal line CB, and the selection signal lines Mux1 to Mux6 all extend in a form of a broken line with a corner of for example 90 degrees, to adapt to the layout of the multiplexing unit, the shift register unit, and the electrostatic discharge unit.

Figure 7A:
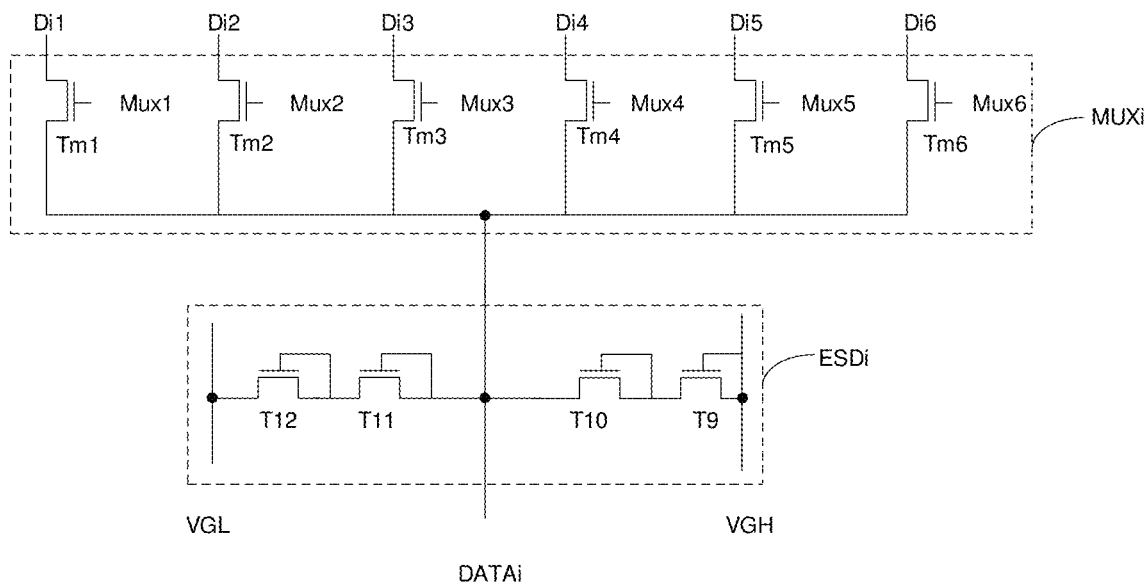
FIG. 7A shows a circuit diagram of an area shown in FIG. 5.

FIG. 7A shows a circuit diagram of the area shown in FIG. 5, in which the circuit structure of each multiplexing unit and the circuit structure of each electrostatic discharge unit are illustrated. As shown in FIG. 7A, the multiplexing unit MUXi and the electrostatic discharge unit ESDi are both connected to the data wire DATAi.

The multiplexing unit MUXi includes transistors Tm1 to Tm6, gates of the transistors Tm1 to Tm6 are electrically connected to the selection signal lines Mux1 to Mux6 in a one-to-one correspondence, and first electrodes of the transistors Tm1 to Tm6 are all connected to the data wire DATAi, second electrodes of the transistors Tm1 to Tm6 are electrically connected to the six data signal lines Di1 to Di6 in a one-to-one correspondence. When a signal at the selection signal line Mux1 is at a high level, the transistor Tm1 is turned on, thereby providing a data signal at the data wire DATAi to the data signal line Di1. When a signal at the selection signal line Mux2 is at a high level, the transistor Tm2 is turned on, thereby providing a data signal at the data wire DATAi to the data signal line Di2, and so on. In this manner, the multiplexing unit MUXi may multiplex one input data signal at the data wire DATAi into six output data signals, and provide the six output data signals to the six data signal lines Di1 to Di6, respectively.

Figure 7B:
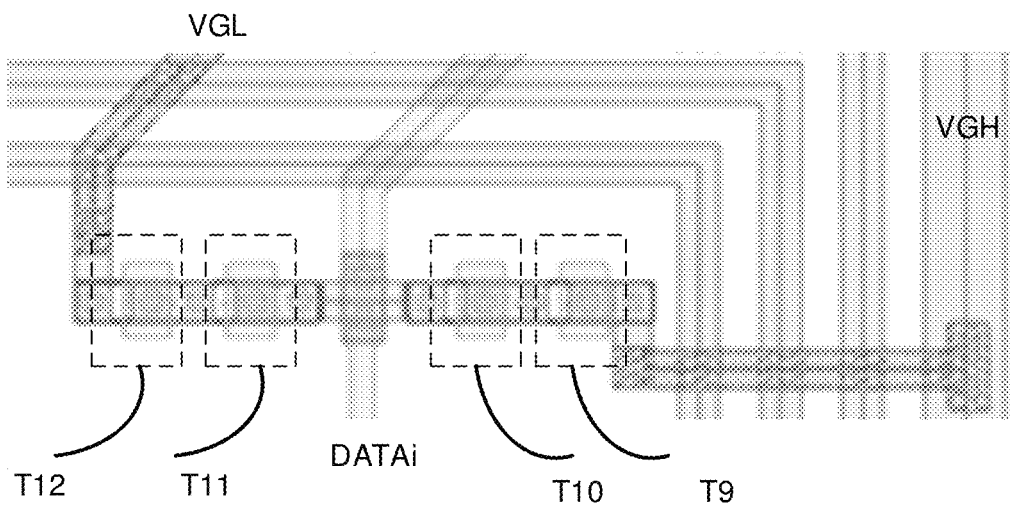
FIG. 7B shows a layout diagram of the electrostatic discharge unit ESDi in FIG. 7A.

FIG. 7B shows a layout diagram of the electrostatic discharge unit ESDi in FIG. 7A. As shown in FIGS. 7A and 7B, the electrostatic discharge unit ESDi includes a ninth transistor T9, a tenth transistor T10, an eleventh transistor T11, and a twelfth transistor T12. A gate of the ninth transistor T9 is electrically connected to a first electrode of the ninth transistor T9, and the gate of the ninth transistor T9 and the first electrode of the ninth transistor T9 are used as the power signal terminal of the electrostatic discharge unit ESDi and are connected to the second power signal line VGH. A second electrode of the ninth transistor T9 is electrically connected to a gate of the tenth transistor T10 and a first electrode of the tenth transistor T10. A second electrode of the tenth transistor T10 is electrically connected to a gate of the eleventh transistor T11 and a first electrode of the eleventh transistor T11, and the gate of the eleventh transistor T11 and the first electrode of the eleventh transistor T1 are used as the output terminal of the electrostatic discharge unit ESDi and are connected to the data wire DATAi. A second electrode of the eleventh transistor T11 is electrically connected to a gate of the twelfth transistor T12 and a first electrode of the twelfth transistor T12. A second electrode of the twelfth transistor T12 is used as the reference signal terminal of the electrostatic discharge unit ESDi and is connected to the second reference signal line VGL. In a case that a potential at the data wire DATAi is higher than a potential at the second power signal line VGH, the ninth transistor T9 and the tenth transistor T10 are turned on, thereby releasing high-voltage static electricity on the data wire DATAi by using the potential at the second power signal line VGH. In a case that a potential at the data wire DATAi is lower than a potential at the second reference signal line VGL, the eleventh transistor T11 and the twelfth transistor T12 are turned on, thereby releasing low-voltage static electricity on the data wire DATAi by using the potential at the second reference signal line VGL.

Figure 8:
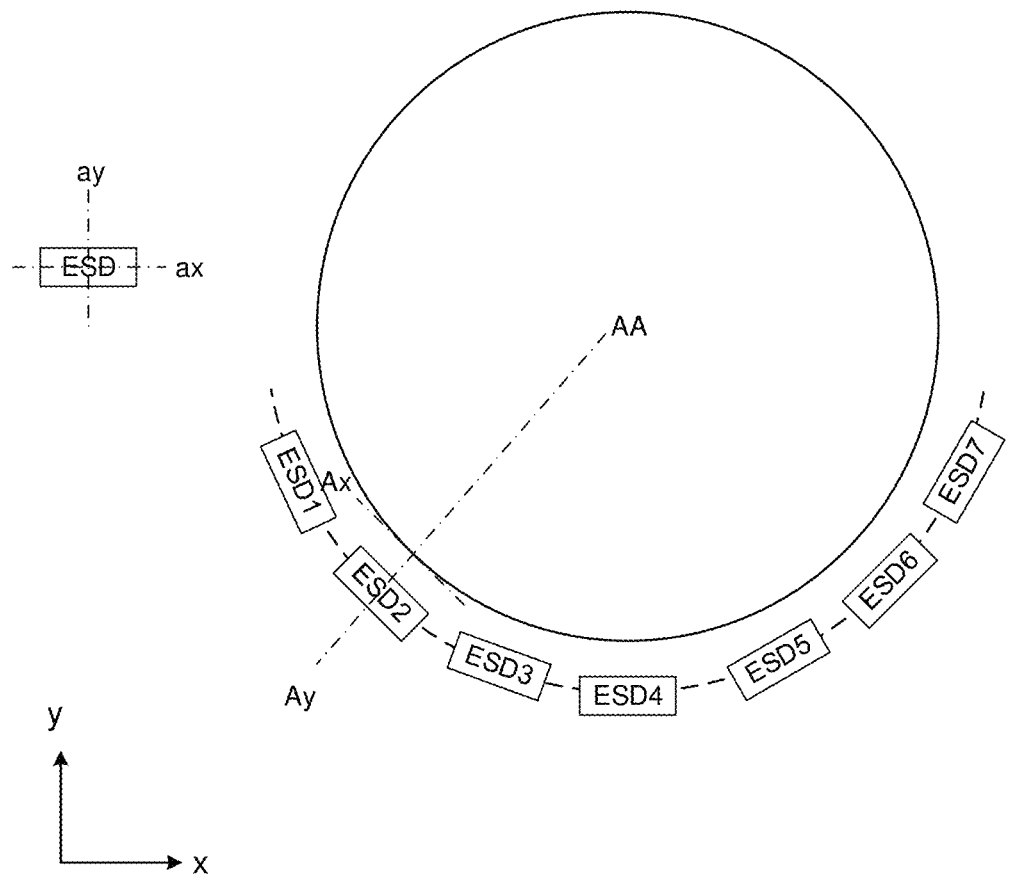
FIG. 8 shows a schematic layout diagram of electrostatic discharge circuits in a display panel according to the embodiments of the present disclosure.

FIG. 8 shows a schematic layout diagram of electrostatic discharge circuits in a display panel according to the embodiments of the present disclosure. A shape of a projection of the display area AA on the base substrate and an arrangement of the electrostatic discharge circuits in FIG. 8 are similar to those in FIG. 4, and FIG. 8 differs from FIG. 4 at least in the placement angle of the electrostatic discharge units. In order to simplify the description, the following will mainly describe the different parts in detail. As shown in FIG. 8, similar to FIG. 4, the projection of the display area AA on the base substrate has a circular outline, and the electrostatic discharge units ESD1, ESD2, . . . ESDm are arranged along an arc-shaped edge on a side of the circular outline, and surround a part of the circular outline. In FIG. 8, different from FIG. 4, the first reference axis ay of each electrostatic discharge unit is parallel to a normal line Ay of an arc-shaped part of the circular outline adjacent to the electrostatic discharge unit. A second reference axis ax is parallel to a tangent line Ax of the arc-shaped part of the circular outline adjacent to the electrostatic discharge unit. In this way, the electrostatic discharge units ESD1, ESD2, . . . ESDm are arranged in an arc shape along a track that is substantially conformal to the outline of the display area AA (as shown by the dashed line in FIG. 4).

Figure 9:
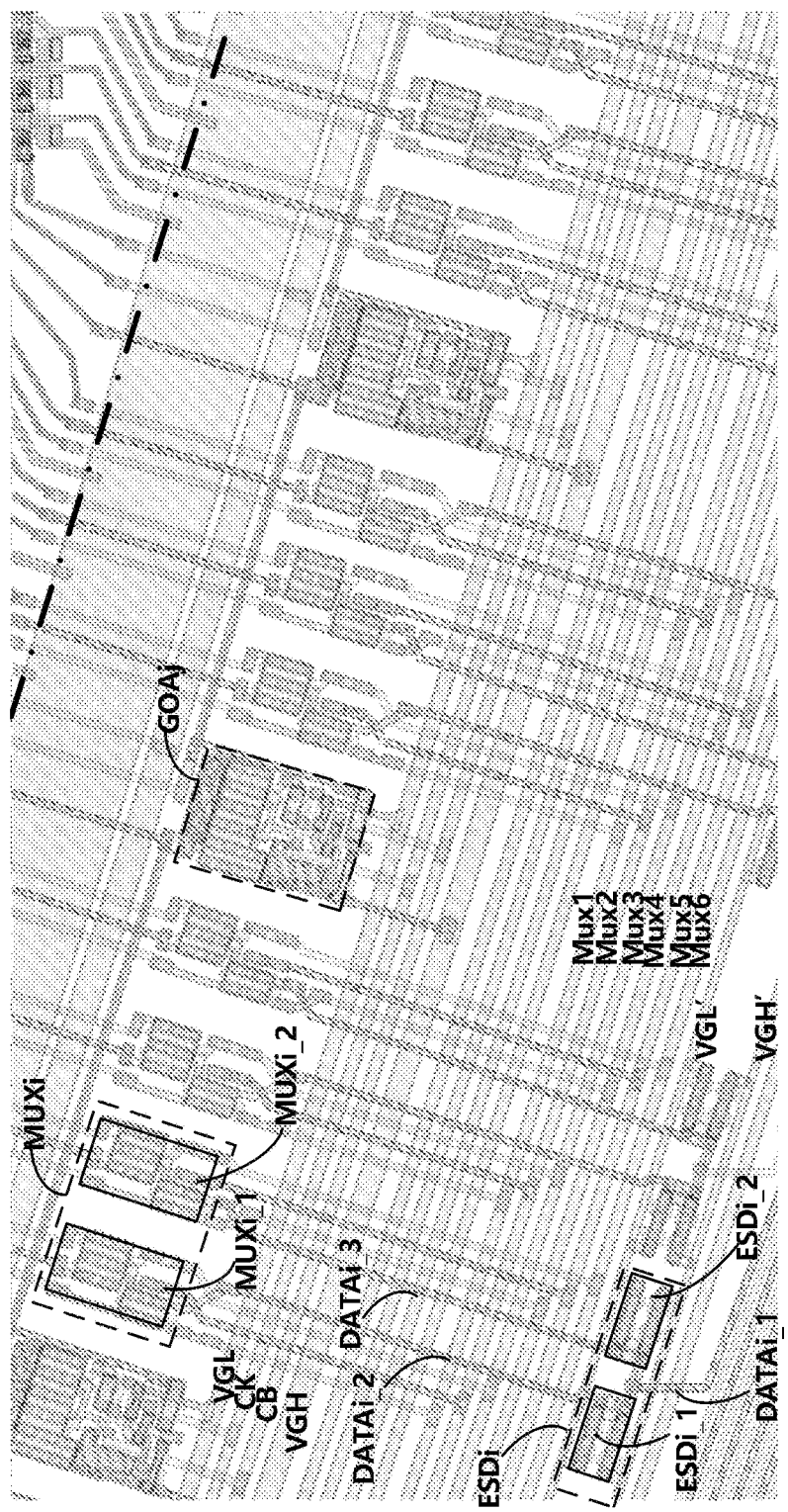
FIG. 9 shows a layout diagram of another example of an area XX of the display panel of FIG. 1B.
Figure 10:
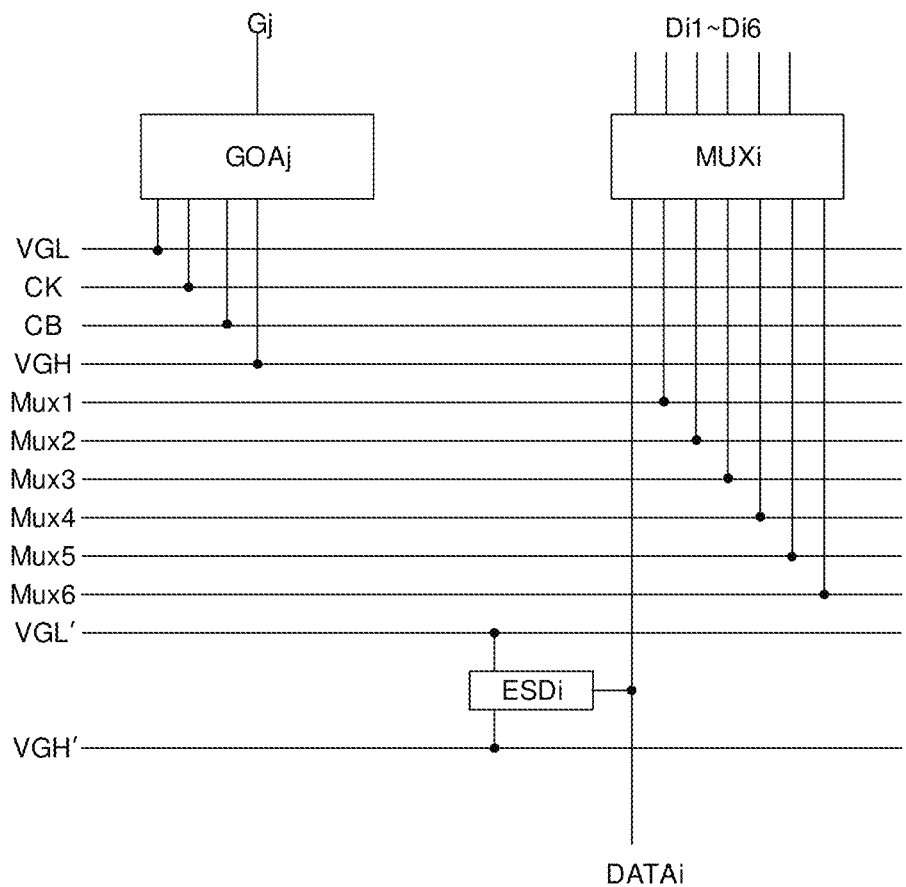
FIG. 10 shows a schematic circuit diagram of an area shown in FIG. 9.

FIG. 9 shows a layout diagram of another example of the area XX of the display panel shown in FIG. 1B. FIG. 10 shows a schematic circuit diagram of the area shown in FIG. 9. The display panel shown in FIGS. 9 and 10 is similar to the display panel shown in FIGS. 5 and 6, at least except for the placement angle of the electrostatic discharge unit, the shift register unit, and the multiplexing unit. Furthermore, in FIGS. 9 and 10, the electrostatic discharge circuit in the display panel is connected to a separate set of a first power signal line VGH' and a first reference signal line VGL' instead of sharing the second power signal line VGH and the second reference signal line VGL with the gate driving circuit. In order to simplify the description, the following will mainly describe the different parts in detail.

Similar to FIGS. 5 and 6, the display panel in FIGS. 9 and 10 includes electrostatic discharge units ESD1, ESD2, . . . ESDm, multiplexing units MUX1, MUX2, . . . MUXm, and shift register units GOA1, GOA2, . . . GOAN. For ease of description, an electrostatic discharge unit ESDi, a multiplexing unit MUXi, and a shift register unit GOAj are denoted with dashed boxes in FIG. 9.

In FIG. 9, different from FIG. 5, the electrostatic discharge units ESD1, ESD2, . . . ESDm are arranged in an arc shape along a first track that is substantially conformal to an arc-shaped edge of the display area AA (shown by a dashed-dotted line in FIG. 9) in the manner shown in FIG. 8. The shift register units GOA1, GOA2, . . . GOAN are arranged in an arc shape along a second track that is substantially conformal to the edge of the display area AA in a manner similar to the electrostatic discharge units ESD1, ESD2, . .

. ESDm. The multiplexing units MUX1, MUX2, ... MUXm are also arranged along the second track in a manner similar to the electrostatic discharge units ESD1, ESD2, ... ESDm, and the multiplexing units MUX1, MUX2, ... MUXm are distributed in gaps among the shift register units GOA1, GOA2, ... GOAN. In FIG. 9, the first track and the second track are two tracks extending in parallel, and the second track is located between the display area AA and the first track.

Similar to FIGS. 5 and 6, the display panel in FIGS. 9 and 10 includes a second power signal line VGH, a second reference signal line VGL, a first clock signal line CK, a second clock signal line CB, and selection signal lines Mux1 to Mux6. Each of the shift register units GOA1, GOA2, ... GOAN is connected to the second power signal line VGH, the second reference signal line VGL, the first clock signal line CK, and the second clock signal line CB. Each of the multiplexing units MUX1, MUX2, ... MUXm is connected to the selection signal lines Mux1 to Mux6.

Different from FIGS. 5 and 6, the display panel in FIGS. 9 and 10 further includes a first power signal line VGH' and a first reference signal line VGL'. A power signal terminal of each of the electrostatic discharge units ESD1, ESD2, ... ESDm is electrically connected to the first power signal line VGH', and a reference signal terminal of each of the electrostatic discharge units ESD1, ESD2, ... ESDm is electrically connected to the first reference signal line VGL', an output terminal of each of the electrostatic discharge units ESD1, ESD2, ... ESDm is electrically connected to at least one of the data wires DATA1, DATA2, ... DATAm. In FIG. 9, the first reference signal line VGL' is located between the electrostatic discharge circuit 120 including the plurality of electrostatic discharge units ESD1, ESD2, ... ESDm and the display area AA, and the first power signal line VGH' is located between the electrostatic discharge circuit 120 including the plurality of electrostatic discharge units ESD1, ESD2, ... ESDm and the encapsulation area PA. The second power signal line VGH is located between the gate driving circuit 140 including the shift register units GOA1, GOA2, ... GOAN and the first reference signal line VGL', and the second reference signal line VGL is located between the second power signal line VGH and the gate driving circuit including the shift register units GOA1, GOA2, ... GOAN.

Figure 11:
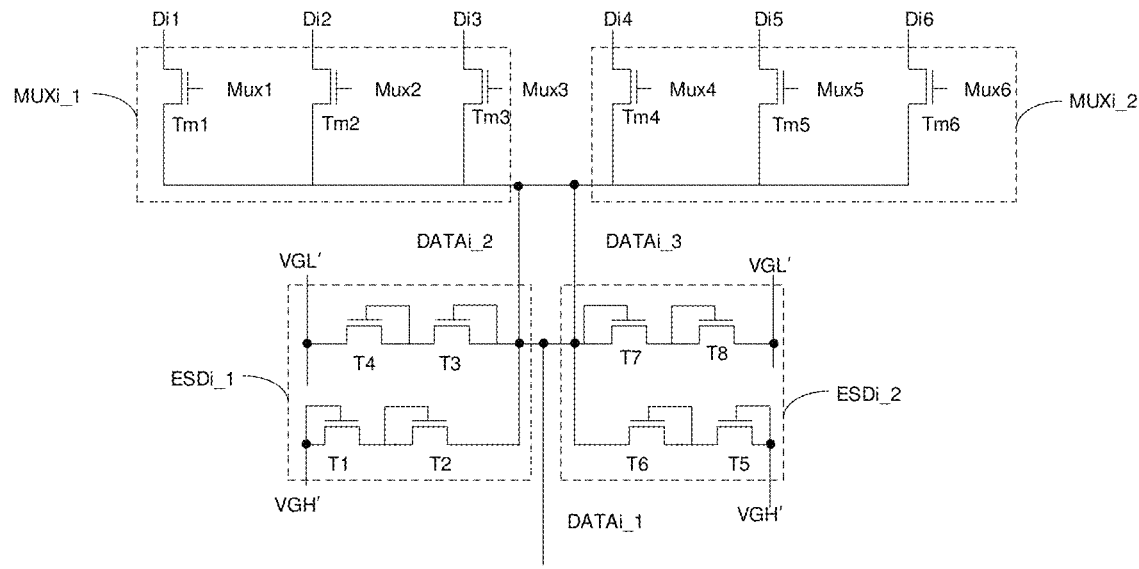
FIG. 11 shows a circuit diagram of an area shown in FIG. 9.

FIG. 11 shows a circuit diagram of the area shown in FIG. 9, in which the circuit structure of each multiplexing unit and the circuit structure of each electrostatic discharge unit are illustrated. A circuit in FIG. 11 is similar to that in FIG. 7, at least except that each multiplexing unit includes a first multiplexing sub-unit and a second multiplexing sub-unit, and each electrostatic discharge unit includes a first electrostatic discharge sub-unit and a second electrostatic discharge sub-unit. In order to simplify the description, the following will mainly describe the different parts in detail.

As shown in FIGS. 9 and 11, the data wire DATAi (the $i^{th}$ data wire) is electrically connected to the multiplexing unit MUXi (the $i^{th}$ multiplexing unit) and the electrostatic discharge unit ESDi (the $i^{th}$ electrostatic discharge unit), and i is an integer and $1 \leq i \leq m$. The electrostatic discharge unit ESDi includes a first electrostatic discharge sub-unit ESDi_1 and a second electrostatic discharge sub-unit ESDi_2. The multiplexing unit MUXi includes a first multiplexing sub-unit MUXi_1 and a second multiplexing sub-unit MUXi_2. The data wire DATAi includes a first sub-wire DATAi_1, a second sub-wire DATAi_2, and a third sub-wire DATAi_3. The first sub-wire DATAi_1 is connected to an input terminal of the first electrostatic discharge sub-unit ESDi_1 and an input terminal of the second electrostatic discharge sub-unit ESDi_2. The second sub-wire DATAi_2 is connected between the input terminal of the first electrostatic discharge sub-unit ESDi_1 and an input terminal of the first multiplexing sub-unit MUXi_1. The third sub-wire DATAi_3 is connected between the input terminal of the second electrostatic discharge sub-unit ESDi_2 and an input terminal of the second multiplexing sub-unit MUXi_2.

In FIGS. 9 and 11, the first electrostatic discharge sub-unit ESDi_1 includes a first transistor T1, a second transistor T2, a third transistor T3, and a fourth transistor T4. A gate of the first transistor T1 is electrically connected to a first electrode of the first transistor T1, and the gate of the first transistor T1 and the first electrode of the first transistor T1 are used as a power signal terminal of the first electrostatic discharge sub-unit ESDi_1 and are electrically connected to the first power signal line VGH'. A second electrode of the first transistor T1 is electrically connected to a gate of the second transistor T2 and a first electrode of the second transistor T2. A second electrode of the second transistor T2 is electrically connected to a gate of the third transistor T3 and a first electrode of the third transistor T3, and the second electrode of the second transistor T2, the gate of the third transistor T3 and the first electrode of the third transistor T3 are used as an input terminal of the first electrostatic discharge sub-unit ESDi_1 and are electrically connected to the second sub-wire DATAi_2. A second electrode of the third transistor T3 is electrically connected to a gate of the fourth transistor T4 and a first electrode of the fourth transistor T4. A second electrode of the fourth transistor T4 is used as a reference signal terminal of the first electrostatic discharge sub-unit ESDi_1 and is electrically connected to the first reference signal line VGL'.

In FIGS. 9 and 11, the second electrostatic discharge sub-unit ESDi_2 includes a fifth transistor T5, a sixth transistor T6, a seventh transistor T7, and an eighth transistor T8. A gate of the fifth transistor T5 is electrically connected to a first electrode of the fifth transistor T5, the gate of the fifth transistor T5 and the first electrode of the fifth transistor T5 are used as a power signal terminal of the second electrostatic discharge sub-unit ESDi_2 and are electrically connected to the first power signal line VGH'. A second electrode of the fifth transistor T5 is electrically connected to a gate of the sixth transistor T6 and a first electrode of the sixth transistor T6. A second electrode of the sixth transistor T6 is electrically connected to a gate of the seventh transistor T7 and a first electrode of the seventh transistor T7, and the second electrode of the sixth transistor T6, the gate of the seventh transistor T7 and the first electrode of the seventh transistor T7 are used as an input terminal of the second electrostatic discharge sub-unit ESDi_2 and are electrically connected to the third sub-wire DATAi_3. A second electrode of the seventh transistor T7 is electrically connected to a gate of the eighth transistor T8 and a first electrode of the eighth transistor T8. A second electrode of the eighth transistor T8 is used as a reference signal terminal of the second electrostatic discharge sub-unit ESDi_2 and is electrically connected to the first reference signal line VGL'.

In FIGS. 9 and 11, the first multiplexing sub-unit MUXi_1 includes transistors Tm1, Tm2, and Tm3, and the second multiplexing sub-unit MUXi_2 includes transistors Tm4, Tm5, and Tm6. Gates of the transistors Tm1 to Tm6 are connected to the selection signal lines Mux1 to Mux6, respectively, and second electrodes of the transistors Tm1 to Tm6 are connected to six data signal lines Di1 to Di6, respectively. First electrodes of the transistors Tm1, Tm2, and Tm3 are used as an input terminal of the first multiplexing sub-unit MUXi_1 and are connected to the second sub-wire DATAi_2. First electrodes of the transistors Tm4, Tm5, and Tm6 are used as an input terminal of the second multiplexing sub-unit MUXi_2 and are connected to the third sub-wire DATAi_3.

Figure 12:
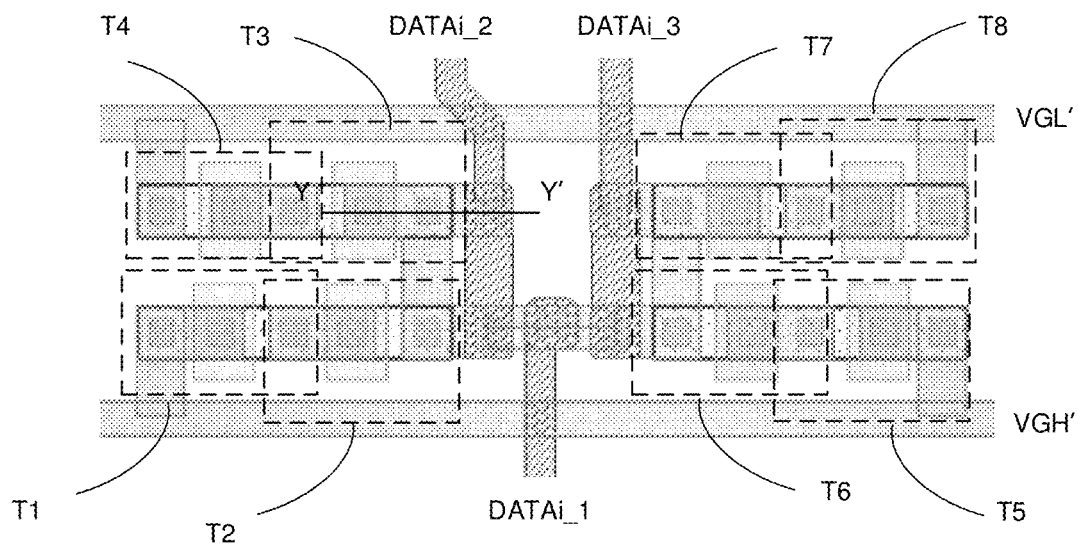
FIG. 12 shows an enlarged layout diagram of an electrostatic discharge circuit in FIG. 9.

FIG. 12 shows an enlarged layout diagram of an electrostatic discharge circuit in FIG. 9.

As shown in FIGS. 9 and 12, the first electrostatic discharge sub-unit ESDi_1 of the electrostatic discharge unit ESDi includes a first transistor T1, a second transistor T2, a third transistor T3, and a fourth transistor T4. The second electrostatic discharge sub-unit ESDi_2 of the electrostatic discharge unit ESDi includes a fifth transistor T5, a sixth transistor T6, a seventh transistor T7, and an eighth transistor T8. The first sub-wire DATAi_1 of the data wire DATAi is connected to an input terminal of the first electrostatic discharge sub-unit ESDi_1 and an input terminal of the second electrostatic discharge sub-unit ESDi_2. The second sub-wire DATAi_2 of the data wire DATAi is connected between the input terminal of the first electrostatic discharge sub-unit ESDi_1 and an input terminal of the first multiplexing sub-unit MUXi_1 of the multiplexing unit MUXi. The third sub-wire DATAi_3 of the data wire DATAi is connected between the input terminal of the second electrostatic discharge sub-unit ESDi_2 and an input terminal of the second multiplexing sub-unit MUXi_2 of the multiplexing unit MUXi.

Figure 13A:
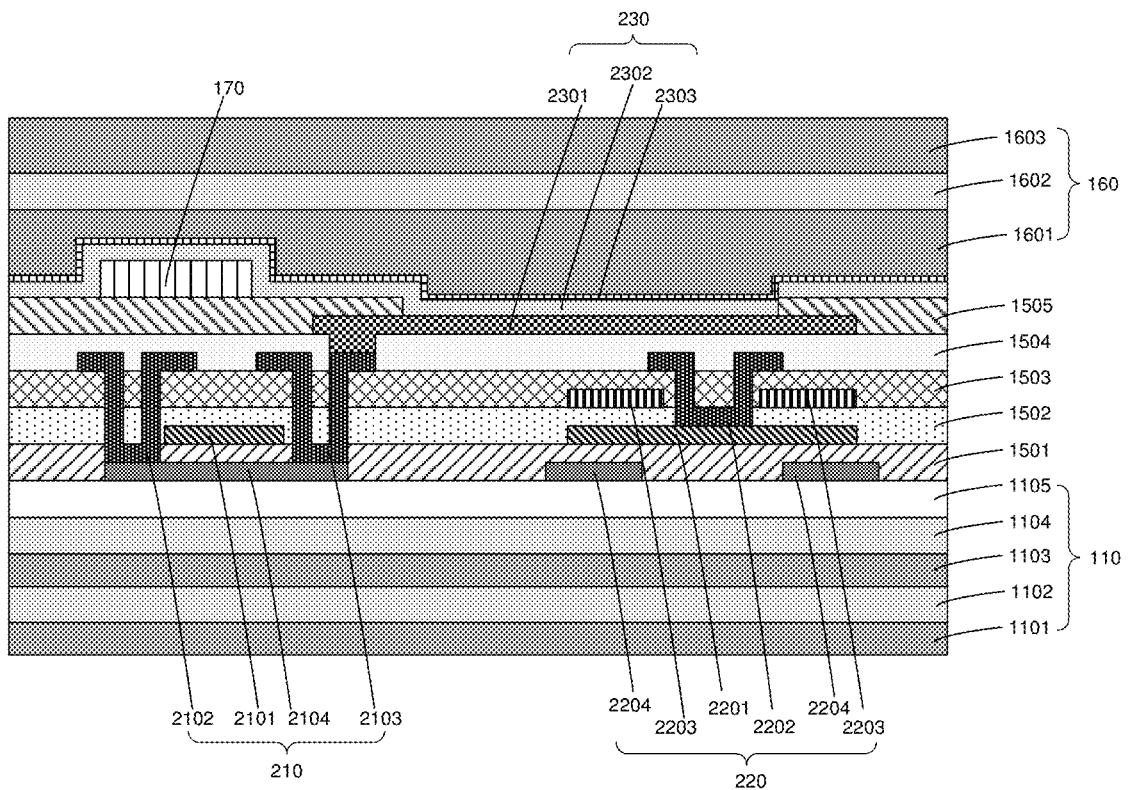
FIG. 13A shows a cross-sectional view of a display area of a display panel according to the embodiments of the present disclosure.

FIG. 13A shows a cross-sectional view of a display area of a display panel according to the embodiments of the present disclosure. The cross-sectional view of FIG. 13A is applicable to the display area of the display panel of any of the embodiments described above.

As shown in FIG. 13A, the display panel includes a base substrate 110, sub-pixels located on the base substrate, and an encapsulation layer 160. In FIG. 13A, the base substrate 110 is flexible, and the base substrate 110 includes a first flexible layer 1101, a first barrier layer 1102, a second flexible layer 1103, a second barrier layer 1104, and a buffer layer 1105. The second flexible layer 1103 is located on a side of the first flexible layer 1101 facing a display circuit (for example, including at least one of the above-described sub-pixels, electrostatic discharge circuits, gate driving circuits, multiplexing circuits, and various signal lines and wires, etc.). The first barrier layer 1102 is located between the first flexible layer 1101 and the second flexible layer 1103. The second barrier layer 1104 is located on a side of the second flexible layer 1103 away from the first flexible layer 1101. The buffer layer 1105 is located on a side of the second barrier layer 1104 away from the first flexible layer 1101.

The display panel further includes a first gate insulating layer 1501, a second gate insulating layer 1502, an interlayer insulating layer 1503, and a planarization layer 1504. The first gate insulating layer 1501 is located on the base substrate 110, and the second gate insulating layer 1502 is located on a side of the first gate insulating layer 1501 away from the base substrate 110, and the interlayer insulating layer 1503 is located on a side of the second gate insulating layer 1502 away from the base substrate 110. The planarization layer 1504 is located on a side of the interlayer insulating layer 1503 away from the base substrate 110.

A sub-pixel in the display area AA may include a driving transistor 210, and the driving transistor 210 includes a gate 2101, a source 2102, and a drain 2103. The gate 2101 of the driving transistor 210 is located between the first gate insulating layer 1501 and the second gate insulating layer 1502, and the source 2102 of the driving transistor 210 and the drain 2103 of the driving transistor 210 are located between the interlayer insulating layer 1503 and the planarization layer 1504. The driving transistor 210 may further include an active region 2104. The active region 2104 is located between the base substrate 110 and the first gate insulating layer 1501. The source 2102 of the driving transistor 210 and the drain 2103 of the driving transistor 210 are electrically connected to the active region 2104 through a via hole provided in the first gate insulating layer 1501.

The sub-pixel may further include a storage capacitor 220. A first electrode of the storage capacitor 220 has a first portion 2201 and a second portion 2202, and the first portion 2201 is arranged in a same layer as the gate 2101 of the driving transistor 210, and the second portion 2202 is arranged in a same layer as the source 2102 of the driving transistor 210 and the drain 2103 of the driving transistor 210. The second portion 2202 is electrically connected to the first portion 2201 through via holes provided in the second gate insulating layer 1502 and the interlayer insulating layer 1503. A second electrode 2203 of the storage capacitor 220 is arranged between the second gate insulating layer 1502 and the interlayer insulating layer 1503. A via hole may be provided in the second electrode 2203 of the storage capacitor 220, and the first portion 2201 of the first electrode of the storage capacitor 220 may be connected to the second portion 2202 through the via hole in the second electrode 2203 and the via holes in the second gate insulating layer 1502 and the interlayer insulating layer 1503. The storage capacitor 220 may further include a semiconductive layer 2204. The semiconductive layer 2204 may be located on a side of the first portion 2201 of the first electrode of the storage capacitor 220 facing the base substrate 110, and the semiconductive layer 2204 may be arranged in a same layer as the active region 2104.

The sub-pixel may further include a light-emitting element 230. The light-emitting element 230 is arranged on a side of the planarization layer 1504 away from the base substrate 110. The light-emitting element 230 includes a first electrode 2301, a second electrode 2303, and a light-emitting layer 2302 located between the first electrode 2301 and the second electrode 2303. The first electrode 2301 of the light-emitting element 230 is electrically connected to the drain 2103 of the driving transistor 210 through a via hole provided in the planarization layer 1504.

The display panel may further include an encapsulation layer 160. The encapsulation layer 160 is located on a side of the display circuit (for example, including at least one of the above-described sub-pixels, electrostatic discharge circuits, gate driving circuits, multiplexing circuits, and various signal lines and wires, etc.) away from the base substrate 110. A projection of the electrostatic discharge circuit described above on the base substrate 110 is within a projection of the encapsulation layer 160 on the base substrate. For example, in the above-mentioned FIGS. 1A and 1B, the projection of the encapsulation layer 160 on the base substrate 110 may cover a projection of an area surrounded by the encapsulation area PA on the base substrate 110, so that projections of the display area AA, the multiplexing circuit 120, the electrostatic discharge circuit 130, and the gate driving circuit 140 on the base substrate 110 are all located within the projection of the encapsulation layer 160 on the base substrate 110.

In the example of FIG. 13A, the encapsulation layer 160 includes a first inorganic material layer 1601, a second inorganic material layer 1603, and an organic material layer 1602 located between the first inorganic material layer 1601 and the second inorganic material layer 1603. The first inorganic material layer 1601 is located on a side of the organic material layer 1602 facing the base substrate 110, and the second inorganic material layer 1603 is located on a side of the organic material layer 1602 away from the base substrate 110.

In some embodiments, the display panel further includes a pixel defining layer 1505. As shown in FIG. 13A, the pixel defining layer 1505 is located between the planarization layer 1504 and the light-emitting layer 2302, and covers an edge of the first electrode 2301 of the light-emitting element 230. A spacer 170 is further provided on a side of the driving transistor 210 away from the base substrate 110, and the spacer 170 is located between the pixel defining layer 1505 and the light-emitting layer 2302.

Figure 13B:
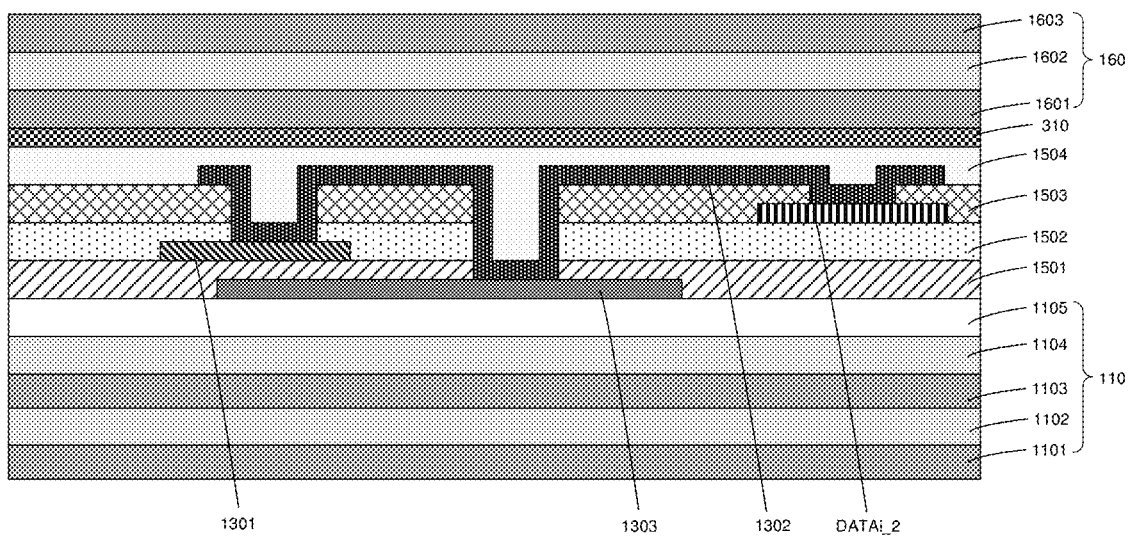
FIG. 13B shows a cross-sectional view of an electrostatic discharge circuit of the display panel of FIG. 13A.

FIG. 13B shows a cross-sectional view of the electrostatic discharge circuit of the display panel of FIG. 13A, and the cross-sectional view is taken along the line Y-Y' of FIG. 12. It may be seen in conjunction with FIG. 12 that, FIG. 13B shows the gate of the third transistor T3 and first electrode of the third transistor T3 of the electrostatic discharge circuit in FIG. 12 and the second sub-wire DATAi_2 of the data wire DATAi connected to the first electrode of the third transistor T3.

Referring to FIGS. 13A and 13B, a gate 1301 of the third transistor T3 is arranged in a same layer as the gate 2101 of the driving transistor 210 in FIG. 13A, and a first electrode 1302 of the third transistor T3 is arranged in a same layer as the source 2102 of the driving transistor 210 and the drain 2103 of the driving transistor 210. In a similar manner, a second electrode of the third transistor T3 is also arranged in a same layer as the source 2102 of the driving transistor 210 and the drain 2103 of the driving transistor 210. The third transistor T3 in the electrostatic discharge circuit is used as an example for a schematic description. However, the embodiments of the present disclosure are not limited to this, and other transistors in the electrostatic discharge circuit (for example, any one or more of the transistors T1 to T8 in FIG. 11, or any one or more of the transistors T9 to T12 in FIG. 7) may have a similar layer structure to the third transistor T3, and the gate of each transistor in the electrostatic discharge circuit may be arranged in a same layer as the gate 2101 of the driving transistor. The first electrode and the second electrode of each transistor in the electrostatic discharge circuit may be arranged in a same layer as the source 2102 of the driving transistor 210 and the drain 2103 of the driving transistor 210.

According to the embodiments of the present disclosure, at least a part of at least one of the plurality of data wires is arranged in a same layer as the second electrode 2203 of the storage capacitor 220 in FIG. 13A or the gate 2101 of the driving transistor 210. For example, the second sub-wire DATAi_2 of the data wire DATAi in FIG. 13B is arranged in a same layer as the second electrode 2203 of the storage capacitor 220 in FIG. 13A. In a similar manner, referring to FIG. 9, the third sub-wire DATAi_3 of the data wire DATAi may also be arranged in a same layer as the second electrode 2203 of the storage capacitor 220 in FIG. 13A. The first sub-wire DATAi_1 of the data wire DATAi may be arranged in a same layer as the gate 2101 of the driving transistor 210 or the second electrode 2203 of the storage capacitor 220 in FIG. 13A. For example, in FIG. 9, the first sub-wire DATAi_1 of the data wire DATAi may be arranged in a same layer as the second electrode 2203 of the storage capacitor 220, and a first sub-wire DATA(i+1)_1 of a data wire DATA(i+1) adjacent to the data wire DATAi may be arranged in a same layer as the gate 2101 of the driving transistor 210. However, the embodiments of the present disclosure are not limited to this, and the data wire may be arranged in different manners as desired. For example, referring to FIG. 5, each of the data wires DATA1, DATA2, . . . DATAm may be arranged in a same layer as the gate 2101 of the driving transistor 210.

In some embodiments, a reference electrode layer 310 is further provided between the electrostatic discharge circuit and the encapsulation layer 150, and the reference electrode layer 310 may be arranged in a same layer as the first electrode 2301 of the light-emitting element 230 in FIG. 13A. A positive voltage signal may be provided to the reference electrode layer 310.

Figure 13C:
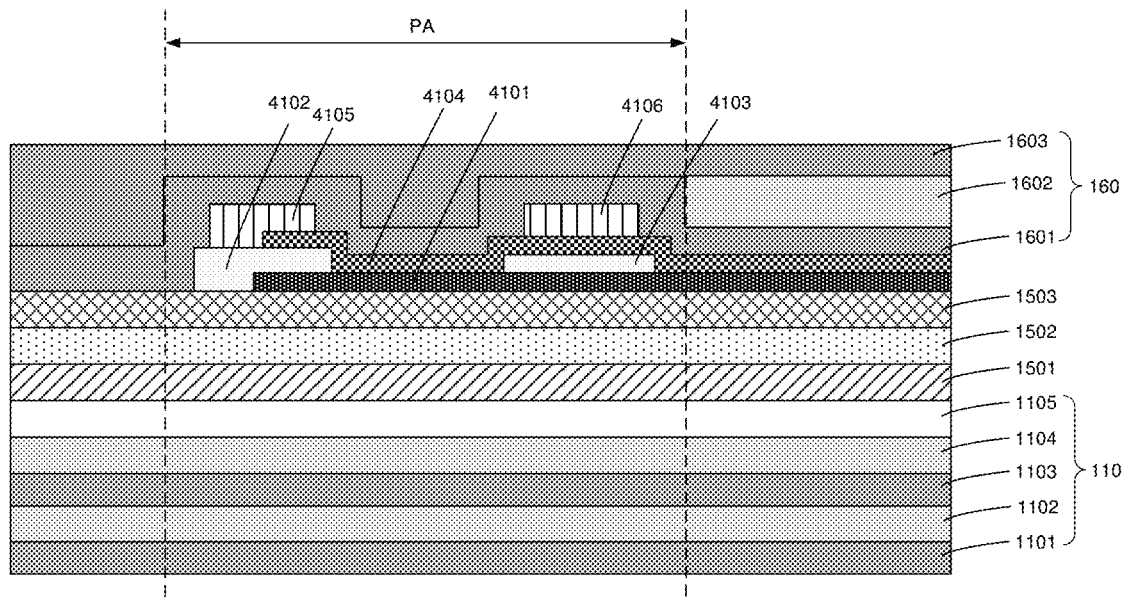
FIG. 13C shows a cross-sectional view of an encapsulation area of the display panel of FIG. 13A.

FIG. 13C shows a cross-sectional view of an encapsulation area of the display panel of FIG. 13A. As shown in FIG. 13C, a dam (DAM) is provided in the encapsulation area PA. The dam includes a groove located in the first inorganic material layer 1601 and a protrusion in the second inorganic material layer 1603 that matches the groove.

In FIG. 13C, a first conductive layer 4101 is provided in the encapsulation area PA, and the first conductive layer 4101 may be arranged in a same layer as the first electrode 2301 of the light-emitting element 230 in FIG. 13A. A first protrusion portion 4102 and a second protrusion portion 4103 is arranged on a side of the first conductive layer 4101 away from the base substrate 110, and the first protrusion portion 4102 covers an edge of the first conductive layer 4101, and the second protrusion portion 4103 is located on a side of the first protrusion portion 4102 facing the display area AA. The first protrusion portion 4102 and the second protrusion portion 4103 may be arranged in a same layer as the planarization layer 1504 in FIG. 13A.

A second conductive layer 4104 is further provided in the encapsulation area PA. The second conductive layer 4104 covers a part of the first protrusion portion 4102, the second protrusion portion 4103, and a part of the first conductive layer 4101 that is not covered by the first protrusion portion 4102 and the second protrusion portion 4103. The second conductive layer 4104 may be arranged in a same layer as the source 2102 of the driving transistor 210 and the drain 2103 of the driving transistor 210 in FIG. 13A.

A third protrusion portion 4105 is arranged on a side of the first protrusion portion 4102 away from the base substrate 110. A fourth protrusion portion 4106 is arranged on a side of the second protrusion portion 4103 away from the base substrate 110. The third protrusion portion 4105 covers an edge of the second conductive layer 4104, and the fourth protrusion portion 4106 is located between the second conductive layer 4104 and the first inorganic material layer 1601. A part of each of the third protrusion portion 4105 and the fourth protrusion portion 4106 may be arranged in a same layer as the pixel defining layer 1505 in FIG. 13A, and another part of each of the third protrusion portion 4105 and the fourth protrusion portion 4106 may be arranged in a same layer as the spacer 170 in FIG. 13A. The first inorganic material layer 1601 covers an edge of the first protrusion portion 4102, the third protrusion portion 4105, the fourth protrusion portion 4106, and a part of the second conductive layer 4104 that is not covered by the third protrusion portion 4105 and the fourth protrusion portion 4106, so that a groove is formed in the encapsulation area PA. The organic material layer 1602 terminates at a sidewall of the groove, and the second inorganic material layer 1603 covers the first inorganic material layer 1601 in the encapsulation area PA, thereby forming a protrusion matching the groove. The second inorganic material layer 1603 also covers the organic material layer 1602 on a side of the encapsulation area PA facing the AA area, thereby achieving encapsulation.

Figure 14A:
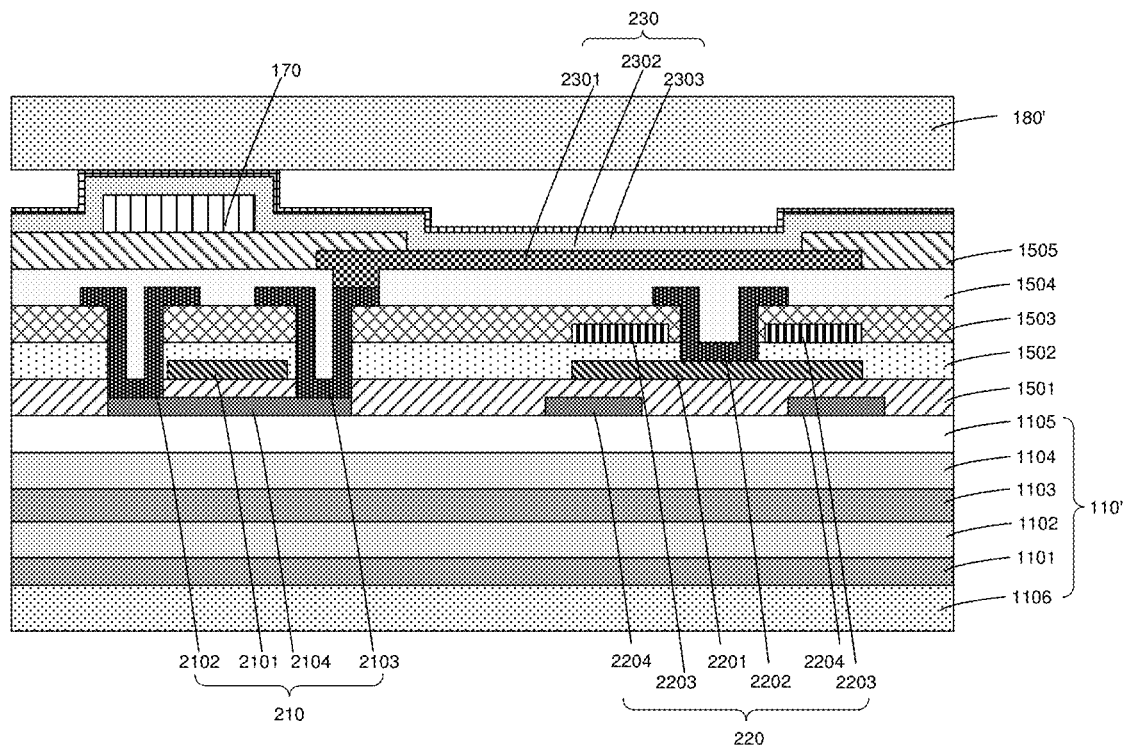
FIG. 14A shows a cross-sectional view of a display area of a display panel according to the embodiments of the present disclosure.
Figure 14B:
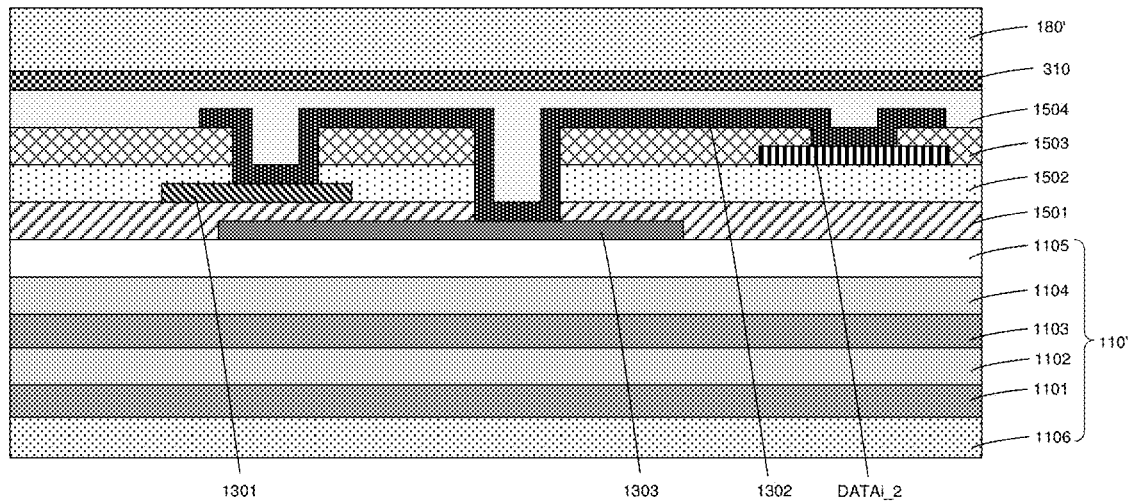
FIG. 14B shows a cross-sectional view of an electrostatic discharge circuit of the display panel of FIG. 14A.
Figure 14C:
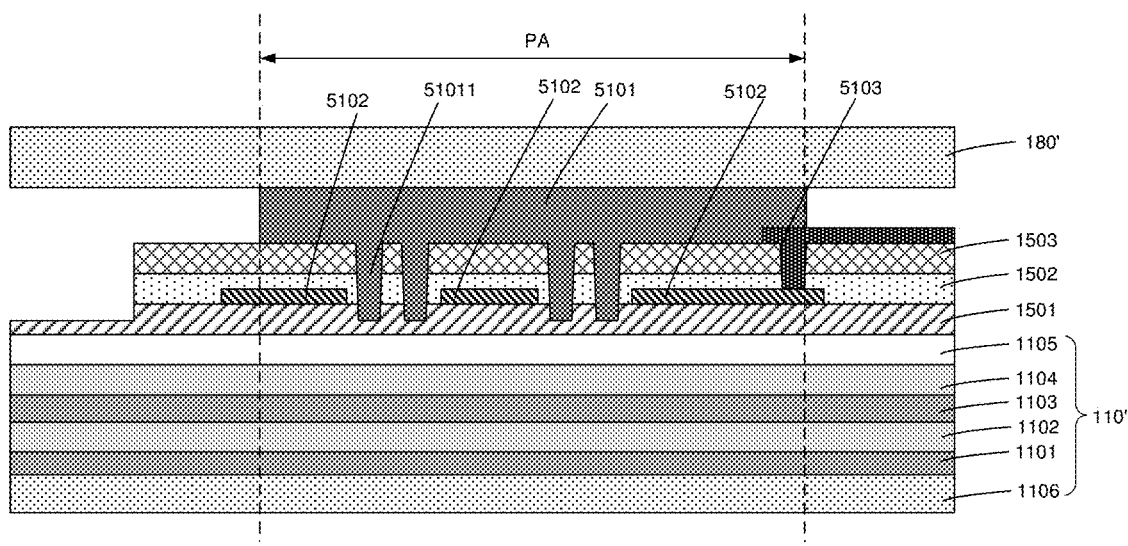
FIG. 14C shows a cross-sectional view of an encapsulation area of the display panel of FIG. 14A.

FIG. 14A shows a cross-sectional view of a display area of a display panel according to the embodiments of the present disclosure. FIG. 14B shows a cross-sectional view of the electrostatic discharge circuit of the display panel of FIG. 14A. The display panel of FIGS. 14A to 14C is similar to the display panel of FIGS. 13A to 13C, and a difference is at least that the base substrate and the encapsulation layer of the display panel of FIGS. 14A to 14C are rigid rather than flexible. In order to simplify the description, the following will mainly describe the different parts in detail.

A layer structure of the display area of the display panel shown in FIG. 14A is similar to that of FIG. 13A, and a layer structure of an area where the electrostatic discharge circuit of the display panel shown in FIG. 14B is located is similar to that of FIG. 13B. In FIGS. 14A and 14B, different from FIGS. 13A and 13B, the base substrate 110' of the display panel is rigid. The base substrate 110' includes a glass substrate 1106 in addition to the first flexible layer 1101, the first barrier layer 1102, the second flexible layer 1103, the second barrier layer 1104, and the buffer layer 1105 that are sequentially stacked as described above. The glass substrate 1106 is located on a side of the first flexible layer 1101 away from the first barrier layer 1102. The encapsulation layer 180' of the display substrate of FIGS. 14A and 14B is also rigid. The encapsulation layer 180' may be a glass cover plate, which is arranged on a side of the display circuit (including the above-mentioned sub-pixels, multiplexing circuit 120, electrostatic discharge circuit 130, etc.) away from the base substrate 110'. The encapsulation layer 180' may cover an area surrounded by the encapsulation area PA as shown in FIGS. 1A and 1B.

A layer structure of the encapsulation area of the display panel shown in FIG. 14C is different from that of FIG. 13C, because the display panel in FIGS. 14A to 14C is rigid display panel which is encapsulated differently from a flexible display panel.

As shown in FIG. 14C, an adhesive layer 5101 is provided in the encapsulation area PA, and the adhesive layer 5101 is located on a side of the glass cover 180' facing the base substrate 110'. A material of the adhesive layer 5101 may include, but is not limited to, Frit glue. In some embodiments, the adhesive layer 5101 may include a plurality of extensions 51011, and the plurality of extensions 51011 may extend into the first gate insulating layer 1501 through via holes provided in the second gate insulating layer 1502 and the interlayer dielectric layer 1503. By providing the plurality of extensions 51011, an adhesive strength of the adhesive layer 5101 may be increased.

A third conductive layer 5102 and a fourth conductive layer 5103 may further be provided in the encapsulation area PA. The third conductive layer 5102 may be arranged in a same layer as the gate 2101 of the driving transistor 210 in FIG. 13A, and the fourth conductive layer 5103 may be arranged in a same layer as the source 2102 of the driving transistor 210 and the drain 2103 of the driving transistor 210 in FIG. 13A. The third conductive layer 5102 is located between the first gate insulating layer 1501 and the second gate insulating layer 1502. A via hole may be provided in the third conductive layer 5102, so that the extension 51011 of the adhesive layer 5101 may extend into the first gate insulating layer 1501 through the via hole in the third conductive layer 5102. The fourth conductive layer 5103 may be located in an edge area on a side of the encapsulation area PA facing the display area AA, and an edge of the fourth conductive layer 5103 is covered by the adhesive layer 5101.

The fourth conductive layer 5103 may be connected to the third conductive layer 5102 through via holes provided in the second gate insulating layer 1502 and the interlayer dielectric layer 1503. A reference voltage VSS may be applied to at least one of the fourth conductive layer 5103 and the third conductive layer 5102.

Although the extension 51011 of the adhesive layer 5101 in the above-mentioned embodiments extends to a specific position (for example, reaching a certain depth in the first gate insulating layer 1501), the embodiments of the present disclosure are not limited to this, and the extension 51011 may extend to different positions as desired, for example, the extension 51011 may extend into the second gate insulating layer 1502, or extend into a deeper position in the first gate insulating layer 1501.

Although the third conductive layer 5102 in the encapsulation area PA in the above-mention embodiments is a conductive layer arranged in a same layer as the gate 2101 of the driving transistor 210, the embodiments of the present disclosure are not limited to this. In some embodiments, the third conductive layer 5102 may be a conductive layer arranged in a same layer as the second electrode 2203 of the storage capacitor 220, or a conductive layer arranged in a same layer as the source 2102 of the driving transistor 210 and the drain 2103 of the driving transistor 210.

Figure 15:
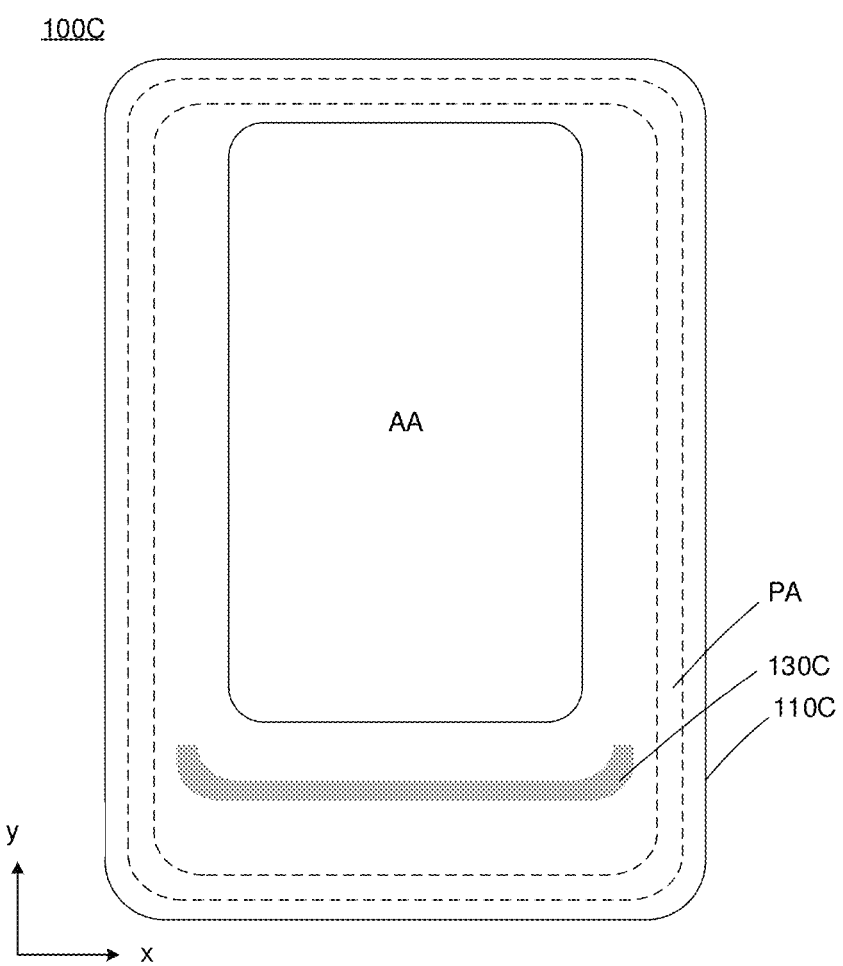
FIG. 15 shows a schematic diagram of a display panel according to the embodiments of the present disclosure.

FIG. 15 shows a schematic diagram of a display panel according to the embodiments of the present disclosure. The display panel of FIG. 15 is similar to the display panel in FIGS. 1A and 1B, at least except that a projection of the display area AA on the base substrate has a rounded rectangular outline instead of a circular outline. In order to simplify the description, the following will mainly describe the different parts in detail.

As shown in FIG. 15, the display panel 100C includes a base substrate 110C and an electrostatic discharge circuit 130C arranged in an area between the display area AA and the encapsulation area PA of the base substrate 110C. The above description of the base substrate and the electrostatic discharge circuit of any embodiment is also applicable to the base substrate 110C and the electrostatic discharge circuit 130C shown in FIG. 15. A difference from the above-mentioned embodiments is that a projection of the display area AA of the display panel 100C on the base substrate 110C has a rounded rectangular outline. The electrostatic discharge circuit 130C is located on a side of the display area AA in the y direction, and the rounded rectangular outline of the display area AA has two arc-shaped edges and a straight edge extending in the x direction on a side facing the electrostatic discharge circuit 130C. A part of a plurality of electrostatic discharge units in the electrostatic discharge circuit 130C are arranged along the two arc-shaped edges of the display area AA, and another part of the plurality of electrostatic discharge units are arranged in a straight line along the straight edge of the display area AA, thereby forming an overall pattern as shown in FIG. 15. The electrostatic discharge units arranged around arc-shaped parts may be placed in a stepped manner similar to that shown in FIG. 4, or placed in an arc-shaped manner similar to that shown in FIG. 8. The electrostatic discharge units arranged in a straight line may be arranged in the x direction, and a first reference axis ay and a second reference axis ax of each electrostatic discharge unit may be parallel to the x direction and the y direction, respectively.

In the display panel 100C, the gate driving circuit may be arranged on both sides of the display area AA in the x direction and located between the encapsulation area PA and the display area AA. The multiplexing circuit may be located between the display area AA and the electrostatic discharge circuit 130C, and arranged in a manner similar to the electrostatic discharge circuit 130C.

Figure 16:
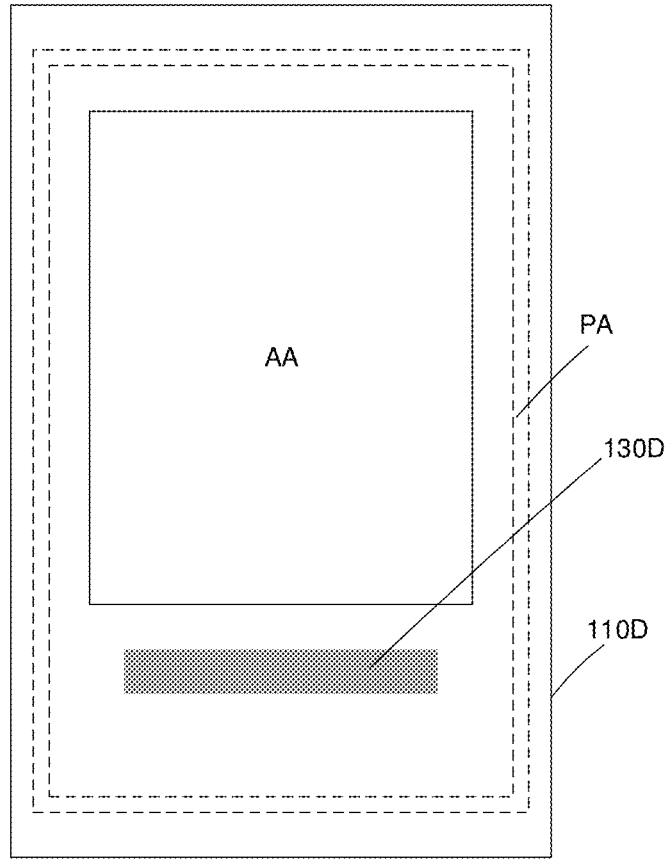
FIG. 16 shows a schematic diagram of a display panel according to the embodiments of the present disclosure.

FIG. 16 shows a schematic diagram of a display panel according to the embodiments of the present disclosure. The display panel of FIG. 16 is similar to the display panel of FIG. 15, at least except that a projection of the display area AA on the base substrate has a rectangular outline instead of a circular outline. As shown in FIG. 16, the display panel 100C includes a base substrate 110D and an electrostatic discharge circuit 130D arranged in an area between the display area AA and the encapsulation area PA of the base substrate 110D. The above description of the base substrate and the electrostatic discharge circuit of any embodiment is also applicable to the base substrate 110D and the electrostatic discharge circuit 130D of FIG. 16. Different from FIG. 15, the display area AA of FIG. 16 has a rectangular outline. A plurality of electrostatic discharge units of the electrostatic discharge circuit 130D are arranged along a straight edge on a side of the rectangular outline facing the electrostatic discharge circuit. A plurality of electrostatic discharge units of the electrostatic discharge circuit 130D are arranged in the x direction in FIG. 16. Similar to FIGS. 4 and 8, each electrostatic discharge unit may have a first reference axis ay and a second reference axis ax, and the first reference axis ay and the second reference axis ax of each electrostatic discharge unit may be parallel to the x direction and the y direction, respectively.

Figure 17:
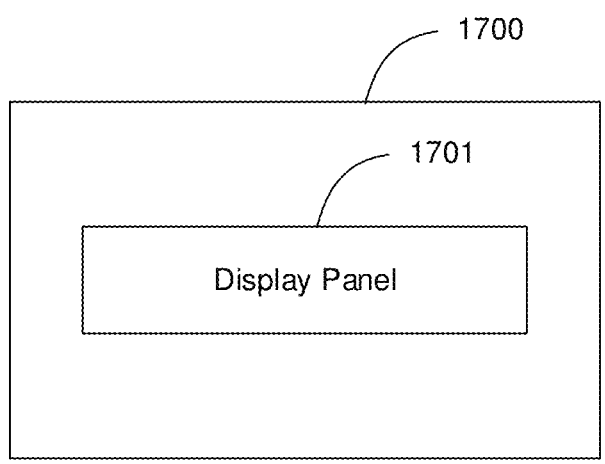
FIG. 17 shows a schematic diagram of a display device according to the embodiments of the present disclosure.

FIG. 17 shows a schematic diagram of a display device according to the embodiments of the present disclosure. As shown in FIG. 17, the display device 1700 includes a display panel 1701. The display panel 1701 may be implemented by the display panel of any of the above-mentioned embodiments.

In some examples, the display device 1700 may further include a flexible circuit board and a control chip. For example, the flexible circuit board is bonded to a bonding area of the display panel, and the control chip is mounted on the flexible circuit board, so that the control chip is electrically connected to the display area. Alternatively, the control chip is directly bonded to the bonding area, so that the control chip is electrically connected to the display area.

For example, the control chip may be a central processor, a digital signal processor, a system chip (SoC), etc. For example, the control chip may further include a memory, and may further include a power supply module, etc., and functions of power supply and signal input and output are realized through separately provided wires, signal lines, and the like. For example, the control chip may further include hardware circuits and computer executable codes. The hardware circuits may include conventional very large-scale integration (VLSI) circuits or gate arrays, and existing semiconductors such as logic chips, transistors, or other discrete components; the hardware circuits may further include field programmable gate arrays, programmable array logic, programmable logic equipment, etc.

For example, the display device provided by at least one embodiment of the present disclosure may be any product or component with a display function, such as a mobile phone, a tablet computer, a television, a monitor, a notebook computer, a digital photo frame, a navigator, and the like.

Those skilled in the art may understand that the embodiments described above are all exemplary, and those skilled in the art may improve them, and the structures described in the various embodiments can be freely combined without conflicts in structure or principle.

After describing the preferred embodiments of the present disclosure in detail, those skilled in the art may clearly understand that various changes and modifications may be made without departing from the scope and spirit of the appended claims, and the present disclosure is not limited to the implementation of the exemplary embodiments mentioned in the specification.

What is claimed is:

1. A display panel, comprising:
a base substrate comprising a display area and a peripheral area surrounding the display area;
a plurality of sub-pixels located in the display area on the base substrate, wherein the plurality of sub-pixels are arranged in an array;
a plurality of data signal lines located in the display area and electrically connected to the plurality of sub-pixels, wherein the plurality of data signal lines are configured to transmit data signals to the plurality of sub-pixels;
a plurality of data wires located in the peripheral area and electrically connected to the plurality of data signal lines;
an electrostatic discharge circuit located in the peripheral area on the base substrate, and electrically connected to the plurality of data wires; and
an encapsulation layer located on a side of the plurality of sub-pixels and the electrostatic discharge circuit away from the base substrate, wherein an orthographic projection of the electrostatic discharge circuit on the base substrate is located within an orthographic projection of the encapsulation layer on the base substrate;
wherein the electrostatic discharge circuit comprises a plurality of electrostatic discharge units electrically connected to the plurality of data wires respectively, wherein at least one or more of the plurality of electrostatic discharge units is arranged along an edge of the display area;
wherein an edge of the display area facing the electrostatic discharge circuit has at least one arc-shaped part, and the at least one or more of the plurality of electrostatic discharge units is arranged along the at least one arc-shaped part.

2. The display panel according to claim 1, wherein an edge of the peripheral area comprises a ring-shaped encapsulation area surrounding the display area, a ring-shaped dam is provided within the encapsulation area, and the electrostatic discharge circuit is located between the encapsulation area and the display area.

3. The display panel according to claim 2, wherein the encapsulation layer comprises a first inorganic material layer, a second inorganic material layer, and an organic material layer located between the first inorganic material layer and the second inorganic material layer, wherein the organic material layer is located in an area enclosed by the ring-shaped dam, and the first inorganic material layer and the second inorganic material layer are located on a side of the dam away from the base substrate.

4. The display panel according to claim 1, wherein:
the encapsulation layer comprises a cover plate; and
an edge of the peripheral area comprises a ring-shaped encapsulation area surrounding the display area, an adhesive layer is provided within the encapsulation area on a side of the cover plate facing the base substrate, and the electrostatic discharge circuit is located between the encapsulation area and the display area.

5. The display panel according to claim 1, wherein each of the at least one or more of the plurality of electrostatic discharge units has a first reference axis and a second reference axis perpendicular to the first reference axis, wherein the first reference axis is parallel to a normal direction of an arc-shaped part adjacent to the each of the at least one or more of the plurality of electrostatic discharge units, and the second reference axis is parallel to a tangential direction of the arc-shaped part adjacent to the each of the at least one or more of the plurality of electrostatic discharge units.

6. The display panel according to claim 1, wherein each of the at least one or more of the plurality of electrostatic discharge units has a first reference axis and a second reference axis perpendicular to the first reference axis, the first reference axis is parallel to a first direction, and the second reference axis is parallel to a second direction, and wherein the first direction is a row direction of the array, and the second direction is a column direction of the array.

7. The display panel according to claim 1, wherein the display area has a circular outline, and the plurality of electrostatic discharge units are arranged along an arc-shaped edge of the circular outline on a side of the circular outline facing the electrostatic discharge circuit.

8. The display panel according to claim 1, wherein the display area has a rounded rectangular outline, one or more of the plurality of electrostatic discharge units is arranged along a rounded arc-shaped edge of the rounded rectangular outline on a side of the rounded rectangular outline facing the one or more of the plurality of electrostatic discharge units, and another one or more of the plurality of electrostatic discharge units is arranged along a straight edge of the rounded rectangular outline on a side of the rounded rectangular outline facing the another one or more of the plurality of electrostatic discharge units.

9. The display panel according to claim 1, wherein the display area has a rectangular outline, and the plurality of electrostatic discharge units are arranged along a straight edge of the rectangular outline on a side of the rectangular outline facing the plurality of electrostatic discharge units.

10. The display panel according to claim 1, further comprising:
a first power signal line located between the electrostatic discharge circuit and the display area, and electrically connected to the electrostatic discharge circuit; and
a first reference signal line located between the electrostatic discharge circuit and the encapsulation area, and electrically connected to the electrostatic discharge circuit, wherein a voltage at the first power signal line is higher than a voltage at the first reference signal line.

11. The display panel according to claim 10, wherein the electrostatic discharge circuit comprises a plurality of electrostatic discharge units, a power signal terminal of each of the plurality of electrostatic discharge units is electrically connected to the first power signal line, a reference signal terminal of each of the plurality of electrostatic discharge units is electrically connected to the first reference signal line, and an output terminal of each of the plurality of electrostatic discharge units is electrically connected to at least one of the plurality of data wires.

12. The display panel according to claim 10, further comprising:
a gate driving circuit located between the display area and the electrostatic discharge circuit;
a plurality of gate signal lines located in the display area and electrically connected to the plurality of sub-pixels, wherein the gate driving circuit is electrically connected to the plurality of sub-pixels in the display area through the plurality of gate signal lines;

a second power signal line located between the gate driving circuit and the first reference signal line, and is electrically connected to the gate driving circuit; and
a second reference signal line located between the second power signal line and the gate driving circuit, and electrically connected to the gate driving circuit, wherein a voltage at the second power signal line is higher than a voltage at the second reference signal line.

13. The display panel according to claim 12, further comprising:
a first clock signal line located between the second power signal line and the second reference signal line, and electrically connected to the gate driving circuit; and
a second clock signal line located between the first clock signal line and the second power signal line, and electrically connected to the gate driving circuit
wherein at least one sub-pixel of the plurality of sub-pixels comprises a driving transistor having a gate, a source, and a drain, and
wherein the electrostatic discharge circuit comprises a plurality of electrostatic discharge units, each electrostatic discharge unit comprises a plurality of transistors each having a gate arranged in a same layer as the gate of the driving transistor, and a first electrode and a second electrode arranged in a same layer as the source of the driving transistor and the drain of the driving transistor.

14. The display panel according to claim 1, further comprising:
a gate driving circuit located between the display area and the encapsulation area, and is electrically connected to the plurality of sub-pixels in the display area through a plurality of gate signal lines, wherein the electrostatic discharge circuit is located on a side of the gate driving circuit facing the encapsulation area;
a second power signal line located between the gate driving circuit and the electrostatic discharge circuit, and electrically connected to the gate driving circuit and the electrostatic discharge circuit; and
a second reference signal line located between the second power signal line and the gate driving circuit, and electrically connected to the gate driving circuit and the electrostatic discharge circuit,
wherein the electrostatic discharge circuit comprises a plurality of electrostatic discharge units, a power signal terminal of each electrostatic discharge unit is electrically connected to the second power signal line, a reference signal terminal of each electrostatic discharge unit is electrically connected to the second reference signal line, and an output terminal of each electrostatic discharge unit is electrically connected to at least one of the plurality of data wires.

15. The display panel according to claim 1, further comprising:
a multiplexing circuit located between the display area and the encapsulation area, wherein the plurality of data wires are electrically connected to the plurality of data signal lines through the multiplexing circuit; and
K selection signal lines located between the multiplexing circuit and the electrostatic discharge circuit, and electrically connected to the multiplexing circuit, wherein K is an integer greater than 1,
wherein the electrostatic discharge circuit comprises a plurality of electrostatic discharge units, the multiplexing circuit comprises a plurality of multiplexing units, an input terminal of an $i^{th}$ multiplexing unit and an output terminal of an i$^{th}$ electrostatic discharge unit are connected to an i$^{th}$ data wire in the plurality of data wires, K output terminals of the i$^{th}$ multiplexing unit are connected to K data signal lines of the plurality of data signal lines respectively, and K control signal terminals of the i$^{th}$ multiplexing unit are connected to the K selection signal lines respectively, wherein i is an integer greater than or equal to 1.

16. The display panel according to claim 15, wherein each electrostatic discharge unit comprises a first electrostatic discharge sub-unit and a second electrostatic discharge sub-unit, each multiplexing unit comprises a first multiplexing sub-unit and a second multiplexing sub-unit, and each data wire comprises a first sub-wire, a second sub-wire, and a third sub-wire, wherein the first sub-wire of the i$^{th}$ data wire is connected to an input terminal of the first electrostatic discharge sub-unit of the i$^{th}$ electrostatic discharge unit and an input terminal of the second electrostatic discharge sub-unit of the i$^{th}$ electrostatic discharge unit;

the second sub-wire of the i$^{th}$ data wire is connected between the input terminal of the first electrostatic discharge sub-unit of the i$^{th}$ electrostatic discharge unit and an input terminal of the first multiplexing sub-unit of the i$^{th}$ multiplexing unit; and the third sub-wire of the i$^{th}$ data wire is connected between the input terminal of the second electrostatic discharge sub-unit of the i$^{th}$ electrostatic discharge unit and an input terminal of the second multiplexing sub-unit of the i$^{th}$ multiplexing unit.

17. The display panel according to claim 16, wherein:

the first electrostatic discharge sub-unit comprises a first transistor, a second transistor, a third transistor, and a fourth transistor, a gate of the first transistor and a first electrode of the first transistor are electrically connected as a power signal terminal of the first electrostatic discharge sub-unit, a second electrode of the first transistor is electrically connected to a gate of the second transistor and a first electrode of the second transistor, and a second electrode of the second transistor, a gate of the third transistor, and a first electrode of the third transistor are electrically connected as an output terminal of the first electrostatic discharge sub-unit, and a second electrode of the third transistor is electrically connected to a gate of the fourth transistor and a first electrode of the fourth transistor, and a second electrode of the fourth transistor is used as a reference signal terminal of the first electrostatic discharge sub-unit; and the second electrostatic discharge sub-unit comprises a fifth transistor, a sixth transistor, a seventh transistor, and an eighth transistor, a gate of the fifth transistor and a first electrode of the fifth transistor are electrically connected as a power signal terminal of the second electrostatic discharge sub-unit, a second electrode of the fifth transistor is electrically connected to a gate of the sixth transistor and a first electrode of the sixth transistor, and a second electrode of the sixth transistor, a gate of the seventh transistor and a first electrode of the seventh transistor are electrically connected as an output terminal of the second electrostatic discharge sub-unit, and a second electrode of the seventh transistor is electrically connected to a gate of the eighth transistor and a first electrode of the eighth transistor, and a second electrode of the eighth transistor is used as a reference signal terminal of the second electrostatic discharge sub-unit; or wherein each electrostatic discharge unit comprises a ninth transistor, a tenth transistor, an eleventh transistor, and a twelfth transistor, wherein a gate of the ninth transistor and a first electrode of the ninth transistor are electrically connected as a power signal terminal of the electrostatic discharge unit, and a second electrode of the ninth transistor is electrically connected to a gate of the tenth transistor and a first electrode of the tenth transistor, and a second electrode of the tenth transistor, a gate of the eleventh transistor and a first electrode of the eleventh transistor are electrically connected as an output terminal of the electrostatic discharge unit, a second electrode of the eleventh transistor is electrically connected to a gate of the twelfth transistor and a first electrode of the twelfth transistor, and a second electrode of the twelfth transistor is used as a reference signal terminal of the electrostatic discharge unit.

18. A display device comprising the display panel according to claim 1.

* * * * *